United States Patent
Kojima et al.

(10) Patent No.: US 11,626,307 B2
(45) Date of Patent: Apr. 11, 2023

(54) PROCESSING APPARATUS

(71) Applicant: DISCO CORPORATION, Tokyo (JP)

(72) Inventors: Yoshimasa Kojima, Tokyo (JP); Atsushi Kubo, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 149 days.

(21) Appl. No.: 17/152,873

(22) Filed: Jan. 20, 2021

(65) Prior Publication Data

US 2021/0242061 A1 Aug. 5, 2021

(30) Foreign Application Priority Data

Feb. 4, 2020 (JP) .............................. JP2020-016992

(51) Int. Cl.
| | |
|---|---|
| *H01L 21/68* | (2006.01) |
| *H01L 21/67* | (2006.01) |
| *B23K 26/38* | (2014.01) |
| *H04N 7/18* | (2006.01) |
| *H04N 5/262* | (2006.01) |
| *H04N 23/90* | (2023.01) |

(52) U.S. Cl.
CPC ............ *H01L 21/681* (2013.01); *B23K 26/38* (2013.01); *H01L 21/67092* (2013.01); *H01L 21/67115* (2013.01); *H04N 5/2628* (2013.01); *H04N 7/18* (2013.01); *H04N 23/90* (2023.01); *H04N 5/2624* (2013.01)

(58) Field of Classification Search
CPC ............. H01L 21/681; H01L 21/67092; H01L 21/67115; B23K 26/38; H04N 5/247; H04N 5/2628; H04N 5/2624; H04N 7/18
See application file for complete search history.

(56) References Cited

U.S. PATENT DOCUMENTS

| | | | | |
|---|---|---|---|---|
| 10,482,587 | B2 * | 11/2019 | Negishi | ................. G06T 7/0004 |
| 2019/0035689 | A1 * | 1/2019 | Yamamoto | .......... H01L 21/6836 |
| 2019/0317471 | A1 * | 10/2019 | Kashiwagi | ........... G05B 19/402 |
| 2020/0266091 | A1 * | 8/2020 | Tanaka | ................... B23K 26/38 |

FOREIGN PATENT DOCUMENTS

| | | |
|---|---|---|
| JP | 2006140341 A | 6/2006 |
| JP | 2010087141 A | 4/2010 |

* cited by examiner

*Primary Examiner* — John W Miller
*Assistant Examiner* — Omer Khalid
(74) *Attorney, Agent, or Firm* — Greer, Burns & Crain, Ltd.

(57) ABSTRACT

A processing apparatus includes a chuck table including a plate-shaped holding component having a predetermined region transparent from one surface to the other surface, a processing unit that processes a workpiece, a first imaging unit disposed over the chuck table to acquire a normal image of the back surface side, and a second imaging unit disposed under the chuck table to acquire a normal image of the front surface side, a display device, and a control part that executes image processing of the normal image of either the back or front surface side to cause the normal image subjected to the image processing to be displayed on the display device in the state of being inverted in a predetermined direction in order to allow the orientation of the normal image of the back surface side to correspond with the orientation of the normal image of the front surface side.

14 Claims, 14 Drawing Sheets

PROCESSING APPARATUS

BACKGROUND OF THE INVENTION

Field of the Invention

The present invention relates to a processing apparatus that processes a back surface side of a workpiece on which a predetermined pattern is formed on a front surface side. The processing apparatus processes the back surface side of the workpiece in a state in which the front surface side of the workpiece is held.

Description of the Related Art

Semiconductor device chips used for pieces of electrical equipment such as mobile phones and personal computers are manufactured by processing a wafer (workpiece) that is formed of a semiconductor material such as silicon and has a circular disc shape, for example. Plural planned dividing lines are set on the front surface side of the workpiece and a device such as an integrated circuit (IC), large scale integration (LSI), or micro electro mechanical systems (MEMS) is formed in each of regions marked out by the plural planned dividing lines. To manufacture the device chips from the workpiece, for example, the workpiece is thinned to a predetermined thickness by grinding the back surface side of the workpiece. Thereafter, the workpiece is cut along each planned dividing line to divide the workpiece in units of device. Thus, the device chips are manufactured.

In a cutting step of cutting the workpiece, a cutting apparatus including a cutting unit in which a cutting blade is mounted on one end of a spindle and a chuck table that sucks and holds the workpiece is used. In a normal cutting step, first, the front surface side of the workpiece is set upward and the back surface side of the workpiece is sucked and held by the chuck table. After the back surface side is held, alignment is executed by imaging the front surface side of the workpiece by a first camera disposed over the chuck table. The first camera has an imaging element such as a charge-coupled device (CCD) image sensor or a complementary metal-oxide-semiconductor (CMOS) image sensor for imaging a subject by visible light.

Alignment of position correction and so forth of the workpiece is executed based on a result of imaging of the front surface side of the workpiece on which an alignment mark or the like is formed by the first camera. After the alignment, the workpiece is cut along each planned dividing line by the cutting blade. However, in recent years, in association with diversification of devices, there have been cases in which a workpiece is cut from the back surface side of the workpiece (for example, refer to Japanese Patent Laid-Open No. 2006-140341). In this case, the front surface side of the workpiece is disposed downward and is held by a chuck table. Therefore, it is impossible to image an alignment mark or the like when the back surface side of the workpiece is imaged by the first camera disposed over the chuck table.

Thus, a cutting apparatus including a chuck table formed of a material that is transparent to visible light and a second camera for visible light disposed under the chuck table has been developed (for example, refer to Japanese Patent Laid-Open No. 2010-87141). When the second camera is used, the front surface side of the workpiece can be imaged from the lower side of the chuck table in the state in which the front surface side of the workpiece is held by the chuck table. Therefore, the front surface side of the workpiece can be observed even in the case in which the back surface side of the workpiece is set upward and the front surface side of the workpiece is held by the chuck table.

SUMMARY OF THE INVENTION

However, when an image of the front surface side acquired by the second camera and an image of the back surface side acquired by the first camera are displayed on a display device, such as a liquid crystal display, as they are, the image of the front surface side is displayed in the state of being inverted in the left-right direction or the upward-downward direction compared with the image of the back surface side. As a result, for example, the left direction in the image of the front surface side corresponds to the right direction in the image of the back surface side. Therefore, it is not easy for an operator to recognize the correspondence relation between the front surface side and the back surface side. This imposes a burden on the operator. The present invention is made in view of such a problem and intends to provide a processing apparatus that can reduce the burden on an operator when an image obtained by imaging a workpiece from the lower side of a chuck table is displayed on a display device and the operator executes operation while viewing this displayed image.

In accordance with an aspect of the present invention, there is provided a processing apparatus including a chuck table that includes one surface and the other surface located on an opposite side of the one surface and includes a plate-shaped holding component having a predetermined region formed of a transparent material from the one surface to the other surface, and a processing unit that processes a workpiece having a predetermined pattern on a front surface side in a state in which the front surface side of the workpiece is held by the one surface of the chuck table and a back surface side of the workpiece is exposed upward. The processing apparatus also includes a first imaging unit that has a first imaging element and that is disposed over the chuck table and acquires a normal image of the back surface side, and a second imaging unit that has a second imaging element and that is disposed under the chuck table and acquires a normal image of the front surface side in a region corresponding to a region imaged by the first imaging unit in a thickness direction of the workpiece. The processing apparatus also includes a display device that displays at least one of an image of the back surface side acquired by the first imaging unit and an image of the front surface side acquired by the second imaging unit, and a control part that has a storing device in which a program to execute image processing is stored and a processor that processes an image in accordance with the program, the control part executing the image processing of either the normal image of the back surface side or the normal image of the front surface side to cause the normal image subjected to the image processing to be displayed on the display device in a state of being inverted in a predetermined direction in order to allow orientation of the normal image of the back surface side to correspond with orientation of the normal image of the front surface side.

In accordance with another aspect of the present invention, there is provided a processing apparatus including a chuck table that includes one surface and the other surface located on an opposite side of the one surface and includes a plate-shaped holding component having a predetermined region formed of a transparent material from the one surface to the other surface, and a processing unit that processes a workpiece having a predetermined pattern on a front surface side in a state in which the front surface side of the workpiece is held by the one surface of the chuck table and a back surface side of the workpiece is exposed upward. The processing apparatus also includes a first imaging unit that has a first imaging element and that is disposed over the chuck table and acquires a normal image of the back surface side, a third imaging unit that has a third imaging element and that is disposed under the chuck table and acquires a mirror image of the front surface side in a region corresponding to a region imaged by the first imaging unit in a thickness direction of the workpiece, and a display device that displays at least one of an image of the back surface side acquired by the first imaging unit and an image of the front surface side acquired by the third imaging unit.

The processing apparatus may further include a control part having a storing device in which a program to execute image processing is stored and a processor that processes an image in accordance with the program. The control part executes the image processing of both the normal image of the back surface side and the mirror image of the front surface side to cause the normal and mirror images subjected to the image processing to be displayed on the display device in a state of being inverted in a predetermined direction in order to allow orientation of the normal image of the back surface side to correspond with orientation of the mirror image of the front surface side.

In accordance with another aspect of the present invention, there is provided a processing apparatus including a chuck table that includes one surface and the other surface located on an opposite side of the one surface and includes a plate-shaped holding component having a predetermined region formed of a transparent material from the one surface to the other surface, and a processing unit that processes a workpiece having a predetermined pattern on a front surface side in a state in which the front surface side of the workpiece is held by the one surface of the chuck table and a back surface side of the workpiece is exposed upward. The processing apparatus also includes a fourth imaging unit that has a fourth imaging element and that is disposed over the chuck table and acquires a mirror image of the back surface side, a second imaging unit that has a second imaging element and that is disposed under the chuck table and acquires a normal image of the front surface side in a region corresponding to a region imaged by the fourth imaging unit in a thickness direction of the workpiece, and a display device that displays at least one of an image of the back surface side acquired by the fourth imaging unit and an image of the front surface side acquired by the second imaging unit.

The processing apparatus may further include a control part having a storing device in which a program to execute image processing is stored and a processor that processes an image in accordance with the program. The control part executes the image processing of both the mirror image of the back surface side and the normal image of the front surface side to cause the mirror and normal images subjected to the image processing to be displayed on the display device in a state of being inverted in a predetermined direction in order to allow orientation of the mirror image of the back surface side to correspond with orientation of the normal image of the front surface side.

In accordance with another aspect of the present invention, there is provided a processing apparatus including a chuck table that includes one surface and the other surface located on an opposite side of the one surface and includes a plate-shaped holding component having a predetermined region formed of a transparent material from the one surface to the other surface, and a processing unit that processes a workpiece having a predetermined pattern on a front surface side in a state in which the front surface side of the workpiece is held by the one surface of the chuck table and a back surface side of the workpiece is exposed upward. The processing apparatus also includes a fourth imaging unit that has a fourth imaging element and that is disposed over the chuck table and acquires a mirror image of the back surface side, and a third imaging unit that has a third imaging element and that is disposed under the chuck table and acquires a mirror image of the front surface side in a region corresponding to a region imaged by the fourth imaging unit in a thickness direction of the workpiece. The processing apparatus also includes a display device that displays at least one of an image of the back surface side acquired by the fourth imaging unit and an image of the front surface side acquired by the third imaging unit, and a control part that has a storing device in which a program to execute image processing is stored and a processor that processes an image in accordance with the program, the control part executing the image processing of either the mirror image of the back surface side or the mirror image of the front surface side to cause the mirror image subjected to the image processing to be displayed on the display device in a state of being inverted in a predetermined direction in order to allow orientation of the mirror image of the back surface side to correspond with orientation of the mirror image of the front surface side.

The image of the front surface side may be displayed on the display device together with the image of the back surface side.

Further, the processing unit may be a cutting unit having a spindle where a cutting blade is configured to be mounted on one end of the spindle, or a laser irradiation unit having a laser oscillator that generates a laser beam and a collecting lens that collects the laser beam emitted from the laser oscillator.

The chuck table of the processing apparatus according to the one aspect of the present invention has the predetermined region formed of the transparent material from the one surface to the other surface. Over the chuck table, the first imaging unit that acquires a normal image of the back surface side is disposed. Further, under the chuck table, the second imaging unit that acquires a normal image of the front surface side in the region corresponding to the region imaged by the first imaging unit in the thickness direction of the workpiece is disposed. The processing apparatus further includes the display device and the control part. The display device displays at least one of an image of the back surface side acquired by the first imaging unit and an image of the front surface side acquired by the second imaging unit. The control part executes the image processing of either the normal image of the back surface side or the normal image of the front surface side to cause the normal image subjected to the image processing to be displayed on the display device in the state of being inverted in the predetermined direction in order to allow the orientation of the normal image of the back surface side to correspond with the orientation of the normal image of the front surface side. Due to this, it becomes easy for the operator to recognize the correspondence relation between the front surface side and the back surface side. Therefore, the burden on the operator is reduced.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
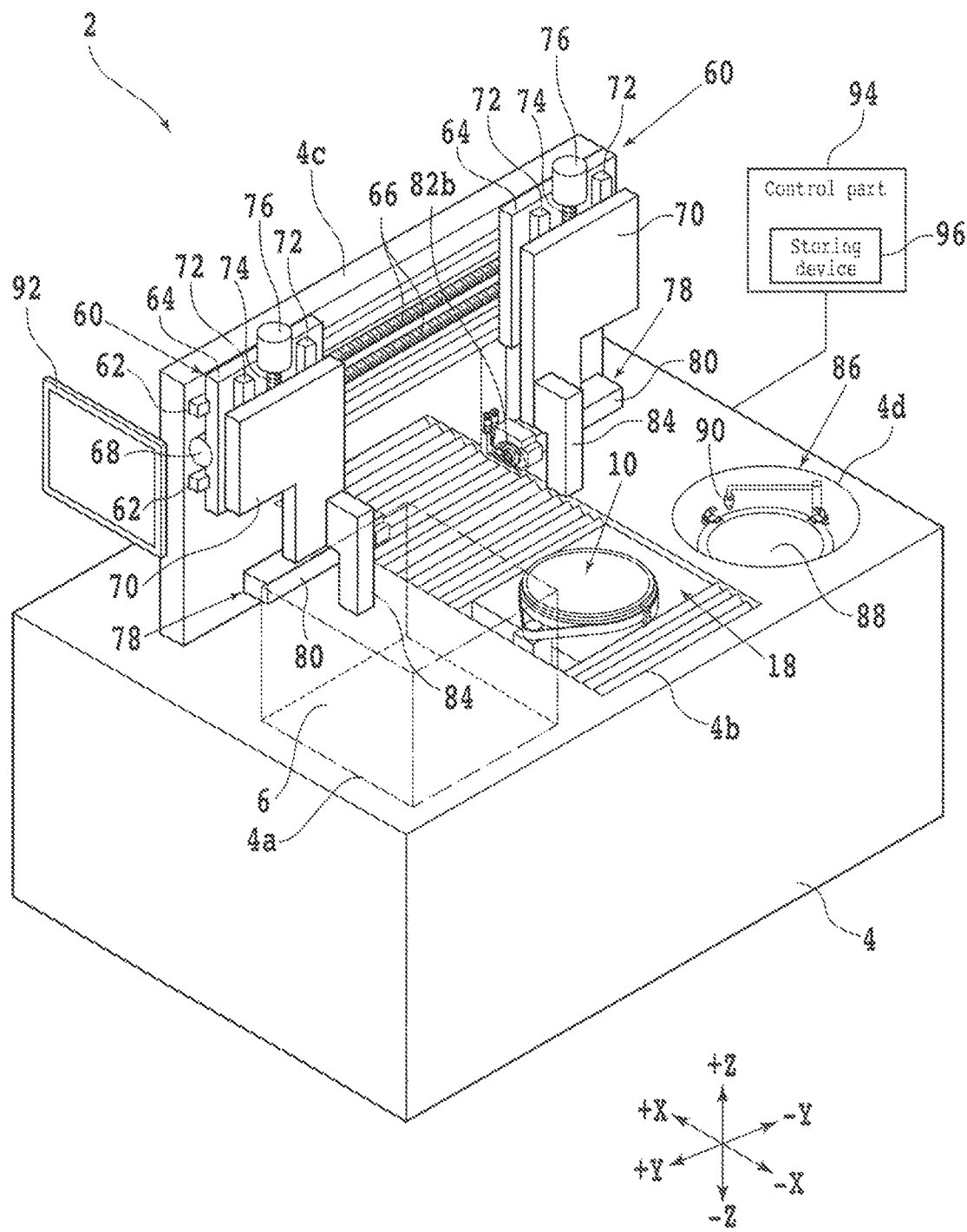
FIG. 1 is a perspective view of a cutting apparatus.

Embodiments according to an aspect of the present invention will be described with reference to the accompanying drawings. FIG. 1 is a perspective view of a cutting apparatus 2 according to a first embodiment. In FIG. 1, some of the constituents are illustrated as a functional block diagram. Further, an X-axis direction (processing feed direction), a Y-axis direction (indexing feed direction), and a Z-axis direction (vertical direction, cutting-in feed direction) that are used for the following explanation are perpendicular to each other. The cutting apparatus (processing apparatus) 2 includes a base 4 that supports the respective constituents. An opening 4a is formed at a corner part on the front side (+Y direction) of the base 4, and a cassette elevator (not illustrated) is disposed in the opening 4a. A cassette 6 for housing plural workpieces 11 (see FIG. 2) is placed on the upper surface of the cassette elevator.

Figure 2:
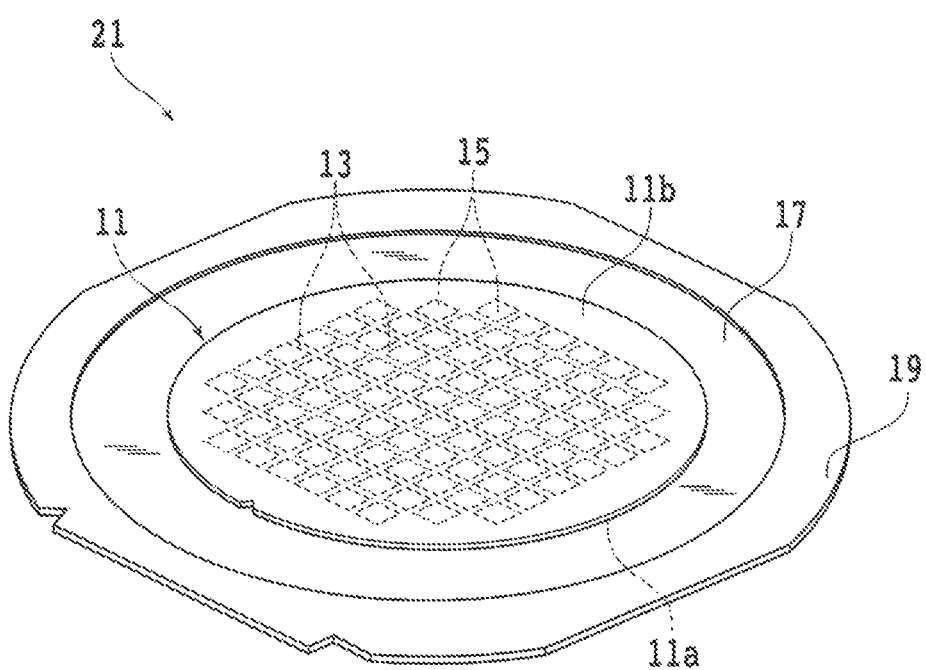
FIG. 2 is a perspective view of a workpiece unit.

The workpiece 11 is a wafer that is composed of a semiconductor material such as silicon and has a circular disc shape, for example. However, there is no limitation on the material, shape, structure, size, and so forth of the workpiece 11. For example, it is also possible to use a substrate or the like composed of a material such as another semiconductor, ceramic, resin, or metal as the workpiece 11. As illustrated in FIG. 2, the side of a front surface 11a of the workpiece 11 is segmented into plural regions by plural planned dividing lines (streets) 13 that intersect each other. In each region on the side of the front surface 11a, a device 15 such as an IC, an alignment mark (mark 98 in FIG. 7A), and so forth are formed. However, there is no limitation on the kind, quantity, shape, structure, size, arrangement, and so forth of the devices 15. The devices 15 do not have to be formed on the workpiece 11.

A tape (dicing tape) 17 larger in diameter than the workpiece 11 is stuck to the side of the front surface 11a of the workpiece 11. The tape 17 is formed of a transparent material through which visible light is transmitted. The tape 17 has a layer-stacking structure with a base layer and an adhesive layer (glue layer), for example. The base layer is formed of polyolefin (PO) or the like, for example. The adhesive layer is formed of an adhesive resin such as an ultraviolet (UV)-curable acrylic resin, for example. The adhesive layer side of the tape 17 is stuck to the side of the front surface 11a of the workpiece 11.

An annular frame 19 formed of a metal is fixed to the peripheral part of the tape 17. As above, the workpiece 11 is housed in the cassette 6 in the state in which a workpiece unit 21 is supported by the frame 19 through the tape 17. FIG. 2 is a perspective view of the workpiece unit 21. As illustrated in FIG. 1, an opening 4b that is long in the X-axis direction is formed on the rear side (−Y direction) of the opening 4a. A chuck table 10 with a circular disc shape is disposed in the opening 4b. A circular annular frame suction plate (not illustrated) in which suction ports are discretely formed along the circumferential direction is disposed at the peripheral part of the chuck table 10.

Figure 3:
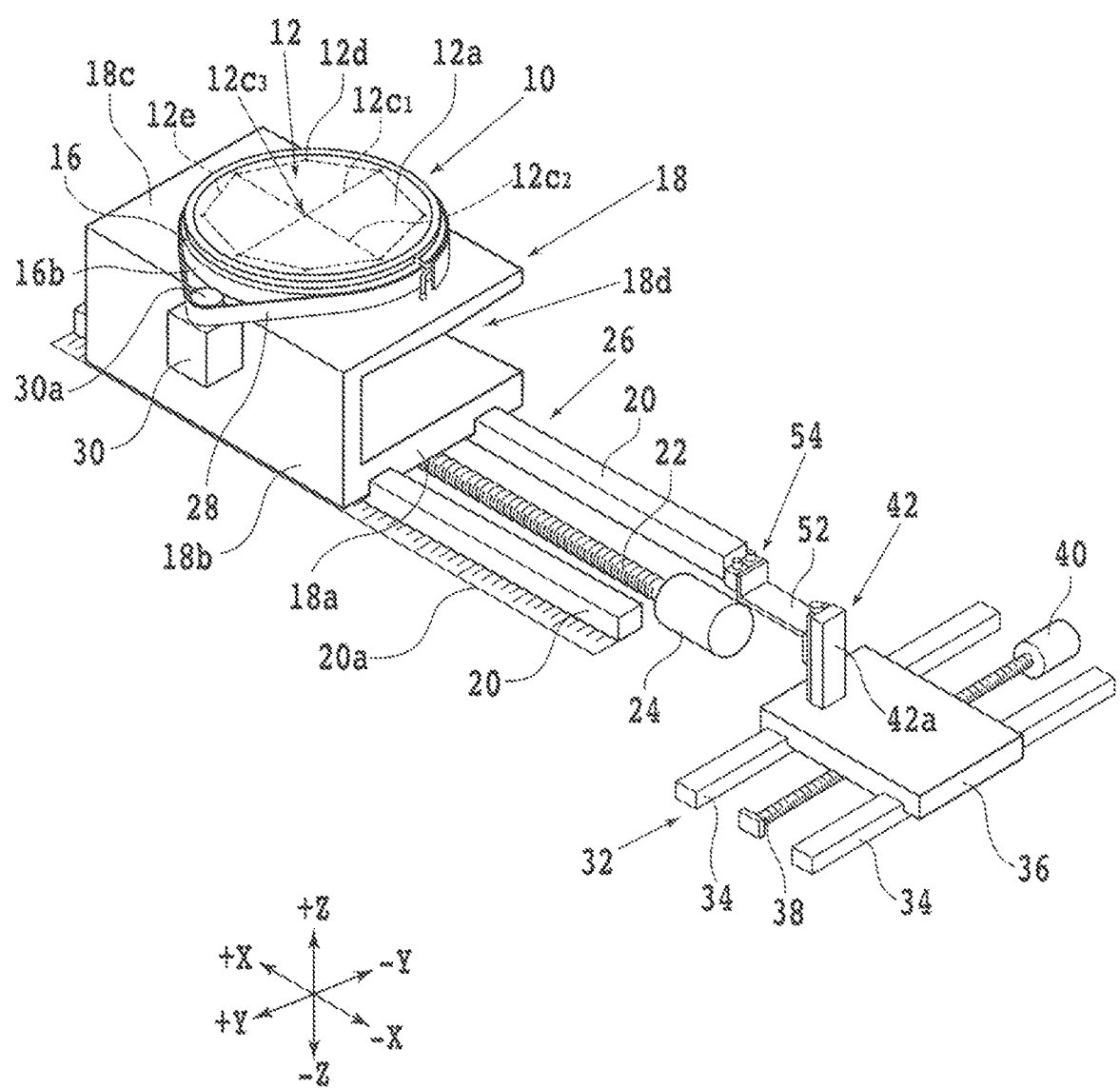
FIG. 3 is a perspective view of a chuck table and so forth.
Figure 4:
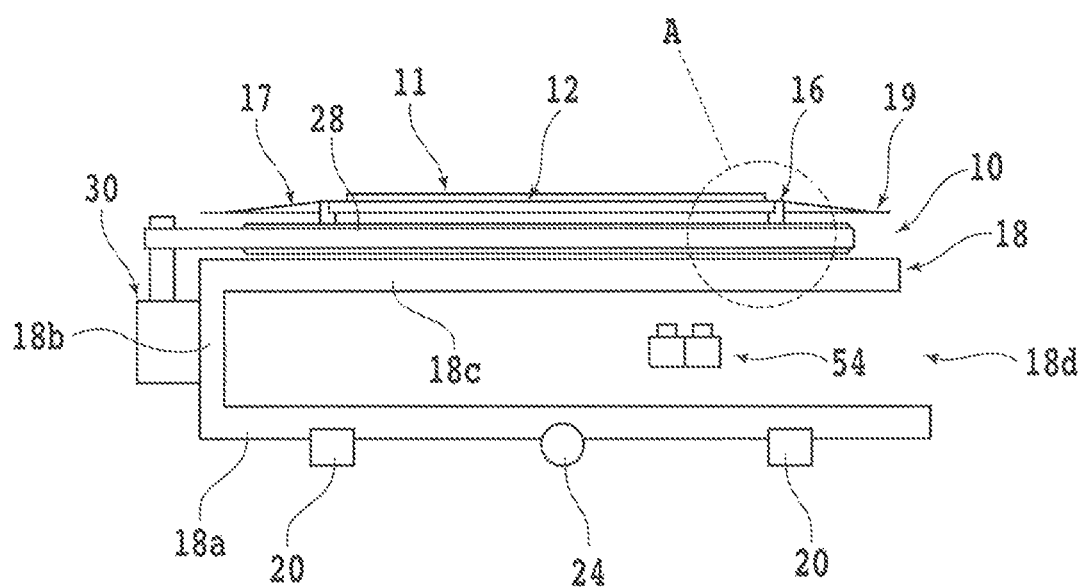
FIG. 4 is a partial sectional side view of the chuck table and so forth.
Figure 4:
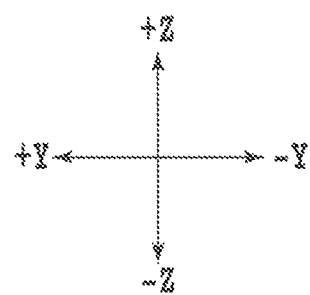
Figure 5:
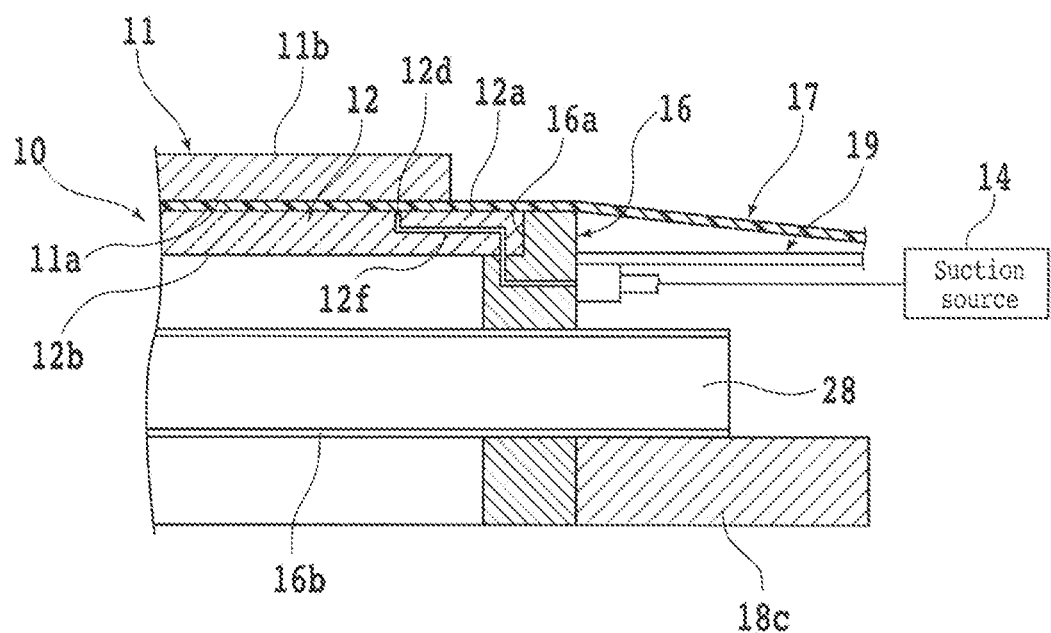
FIG. 5 is an enlarged view of a region A in FIG. 4.

Here, the chuck table 10 and so forth will be described in more detail with reference to FIG. 3 to FIG. 5. FIG. 3 is a perspective view of the chuck table 10 and so forth. FIG. 4 is a partial sectional side view of the chuck table 10 and so forth. In FIG. 4, hatching is omitted for convenience. FIG. 5 is an enlarged view of a region A in FIG. 4. In FIG. 5, some of the constituents are illustrated as a functional block diagram. The chuck table 10 has a holding component 12 with a circular disc shape (plate shape). The holding component 12 includes substantially flat one surface 12a and the other surface 12b (see FIG. 5) located on the opposite side of the one surface 12a. The holding component 12 is formed of a transparent material through which visible light is transmitted, such as soda glass, borosilicate glass, or quartz glass.

Plural flow paths are formed inside the holding component 12. Inside the holding component 12 of the present embodiment, a first suction path $12c_1$ with a straight line shape is formed in such a manner as to traverse the center axis of the circular disc when the holding component 12 is viewed from the Z-axis direction. Further, a second suction path $12c_2$ with a straight line shape is formed in such a manner as to be orthogonal to the first suction path $12c_1$ in the XY-plane direction. The first suction path $12c_1$ and the second suction path $12c_2$ intersect at an intersection $12c_3$ located at the center axis of the circular disc and connect to each other. At the peripheral part of the one surface 12a, plural opening parts 12d are formed separately from each other in the circumferential direction. Each opening part 12d is formed from the one surface 12a to a predetermined depth that does not reach the other surface 12b.

The opening part 12d is formed at each of both end parts of the first suction path $12c_1$ and both end parts of the second suction path $12c_2$. The respective opening parts 12d are connected in the circumferential direction by a peripheral suction path 12e formed at a predetermined depth at the peripheral part of the holding component 12. A suction path 12f that extends in the radial direction is formed on the peripheral side of the opening part 12d, and a suction source 14 such as an ejector is connected to the suction path 12f (see FIG. 5). When the suction source 14 is operated to generate a negative pressure, the negative pressure is generated at the opening parts 12d. Therefore, the one surface 12a functions as a holding surface that sucks and holds the workpiece unit 21 (workpiece 11).

Incidentally, part of incident light is scattered or reflected at the flow paths of the holding component 12, such as the first suction path $12c_1$, the second suction path $12c_2$, the opening parts 12d, the peripheral suction path 12e, and the suction path 12f. Therefore, when being viewed from the one surface 12a or the other surface 12b, the flow paths of the holding component 12 are not completely transparent to visible light and have translucency in some cases and are opaque in other cases. However, predetermined regions excluding the flow paths in the holding component 12 are transparent from the one surface 12a to the other surface 12b. Specifically, regions that arise from dividing into quarters by the first suction path $12c_1$ and the second suction path $12c_2$ and are located inside relative to the peripheral suction path 12e in the radial direction of the holding component 12 are transparent from the one surface 12a to the other surface 12b.

A circular cylindrical frame body 16 formed of a metal material such as stainless steel is disposed at the periphery of the holding component 12. An opening part 16a is formed at the upper part of the frame body 16 (see FIG. 5), and the holding component 12 is disposed to close the opening part 16a. As illustrated in FIG. 3 and FIG. 4, the frame body 16 is supported by an X-axis moving table 18. The X-axis moving table 18 includes a bottom plate 18a having a rectangular shape as viewed from the Z-axis direction. The lower end of a side plate 18b having a rectangular shape as viewed from the Y-axis direction is connected to one end of the bottom plate 18a on the front side (+Y direction).

One end on the front side in a top plate 18c having the same rectangular shape as the bottom plate 18a as viewed from the Z-axis direction is connected to the upper end of the side plate 18b. A space 18d in which one end on the rear side (−Y direction) and both ends in the X-axis direction are opened is formed between the bottom plate 18a and the top plate 18c. On the lower side (−Z direction) of the bottom plate 18a, a pair of X-axis guide rails 20 substantially parallel to the X-axis direction are disposed in such a manner that the bottom plate 18a is slidable thereon. The pair of X-axis guide rails 20 are fixed to the upper surface of a stationary base (not illustrated).

An X-axis linear scale 20a used in detection of the position of the X-axis moving table 18 in the X-axis direction is disposed at a position adjacent to the X-axis guide rail 20. Further, a reading head (not illustrated) is disposed on the lower surface side of the X-axis moving table 18. At the time of movement of the X-axis moving table 18, the position (coordinate) of the X-axis moving table 18 in the X-axis direction and the amount of movement thereof in the X-axis direction are calculated by detecting a scale of the X-axis linear scale 20a by the reading head.

A nut part (not illustrated) is disposed on the lower surface side of the bottom plate 18a of the X-axis moving table 18, and an X-axis ball screw 22 substantially parallel to the X-axis guide rails 20 is rotatably joined to this nut part. An X-axis pulse motor 24 is joined to one end part of the X-axis ball screw 22. When the X-axis ball screw 22 is rotated by the X-axis pulse motor 24, the X-axis moving table 18 moves in the X-axis direction along the X-axis guide rails 20. The X-axis guide rails 20, the X-axis ball screw 22, the X-axis pulse motor 24, and so forth configure an X-axis movement mechanism 26 that moves the X-axis moving table 18.

On the upper surface side of the top plate 18c of the X-axis moving table 18, the frame body 16 is supported by the top plate 18c rotatably around a rotation axis substantially parallel to the Z-axis direction. The frame body 16 includes a pulley part 16b that is a circular cylindrical side surface. The pulley part 16b is located on the upper side relative to the top plate 18c when the frame body 16 is supported by the X-axis moving table 18. A rotational drive source 30 such as a motor is disposed on the side plate 18b of the X-axis moving table 18. A pulley 30a is disposed at the rotation axis of the rotational drive source 30. One rotational endless belt (belt 28) is stretched around the pulley 30a and the pulley part 16b.

When the rotational drive source 30 is operated to rotate the pulley 30a, the frame body 16 rotates around the rotation axis substantially parallel to the Z-axis direction by a force transmitted through the belt 28. By controlling the rotation of the pulley 30a, the chuck table 10 can be rotated by any angle around the rotation axis. A Y-axis movement mechanism 32 is disposed on an extended line of the X-axis movement mechanism 26 in the X-axis direction. The Y-axis movement mechanism 32 includes a pair of Y-axis guide rails 34 substantially parallel to the Y-axis direction. The pair of Y-axis guide rails 34 are fixed to the upper surface of the stationary base (not illustrated).

A Y-axis moving table 36 is slidably attached onto the Y-axis guide rails 34. A nut part (not illustrated) is disposed on the lower surface side of the Y-axis moving table 36, and a Y-axis ball screw 38 substantially parallel to the Y-axis guide rails 34 is rotatably joined to this nut part. A Y-axis pulse motor 40 is joined to one end part of the Y-axis ball screw 38. When the Y-axis ball screw 38 is rotated by the Y-axis pulse motor 40, the Y-axis moving table 36 moves in the Y-axis direction along the Y-axis guide rails 34.

A Y-axis linear scale (not illustrated) used in detection of the position of the Y-axis moving table 36 in the Y-axis direction is disposed at a position adjacent to the Y-axis guide rail 34. Further, a reading head (not illustrated) is disposed on the lower surface side of the Y-axis moving table 36. At the time of movement of the Y-axis moving table 36, the position (coordinate) of the Y-axis moving table 36 in the Y-axis direction and the amount of movement thereof in the Y-axis direction are calculated by detecting a scale of the Y-axis linear scale by the reading head.

Figure 6:
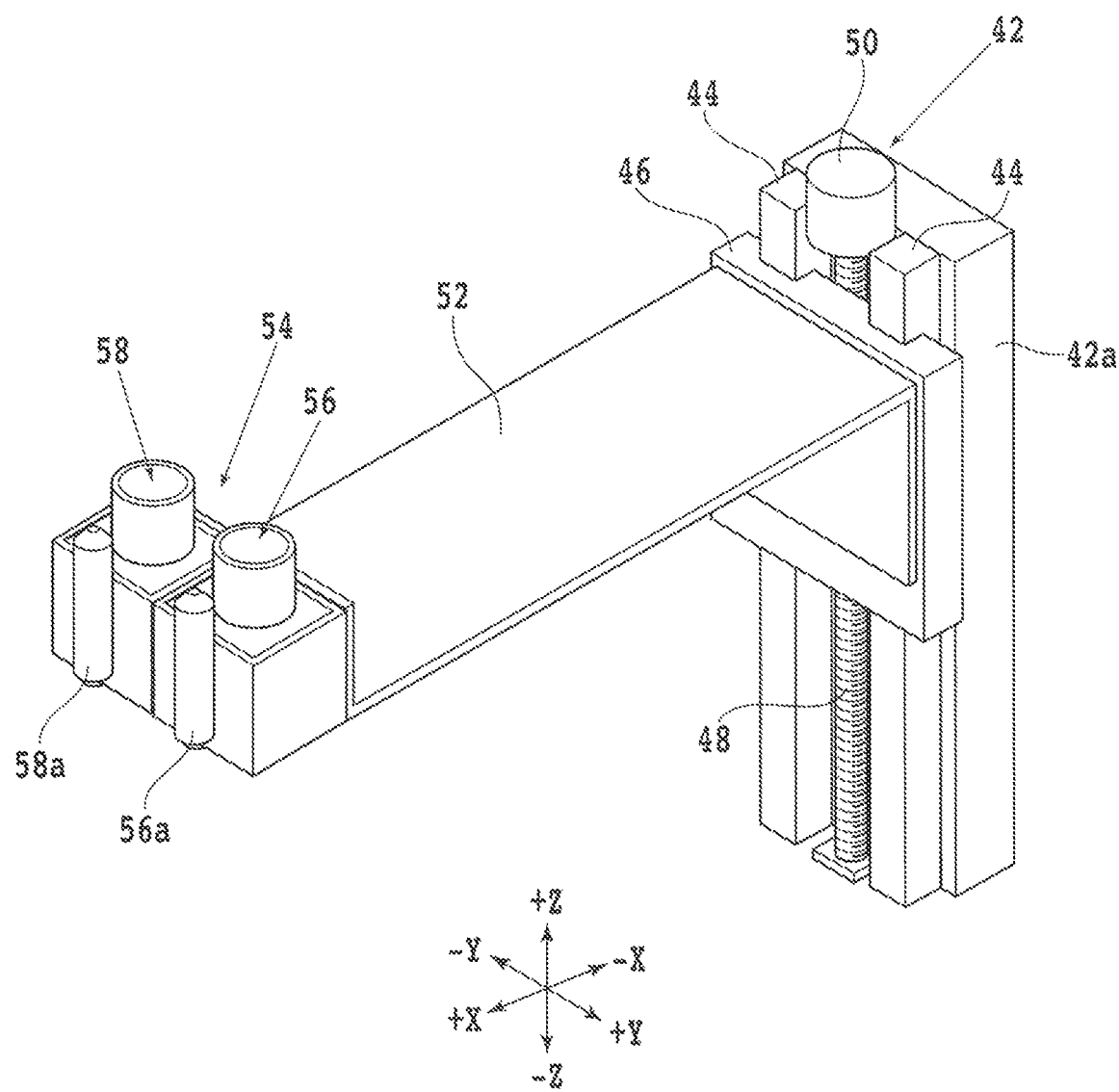
FIG. 6 is an enlarged perspective view of a Z-axis movement mechanism and so forth.

A Z-axis movement mechanism 42 is disposed on the upper surface of the Y-axis moving table 36. FIG. 6 is an enlarged perspective view of the Z-axis movement mechanism 42 and so forth. The Z-axis movement mechanism 42 has a support structure 42a fixed to the upper surface of the Y-axis moving table 36. A pair of Z-axis guide rails 44 substantially parallel to the Z-axis direction are fixed to the side surface of the support structure 42a on the side of the X-axis moving table 18. A Z-axis moving plate 46 is slidably attached onto the Z-axis guide rails 44.

A nut part (not illustrated) is disposed on the back surface side (side surface on the side of the Z-axis guide rails 44) of the Z-axis moving plate 46, and a Z-axis ball screw 48 substantially parallel to the Z-axis guide rails 44 is rotatably joined to this nut part. A Z-axis pulse motor 50 is joined to one end part of the Z-axis ball screw 48. When the Z-axis ball screw 48 is rotated by the Z-axis pulse motor 50, the Z-axis moving plate 46 moves in the Z-axis direction along the Z-axis guide rails 44.

A Z-axis linear scale (not illustrated) is disposed at a position adjacent to the Z-axis guide rail 44, and a reading head (not illustrated) is disposed on the Z-axis moving plate 46 on the side of the Z-axis guide rails 44. At the time of movement of the Z-axis moving plate 46, the position (coordinate) of the Z-axis moving plate 46 in the Z-axis direction and so forth are calculated by detecting a scale of the Z-axis linear scale by the reading head. A lower-side imaging unit (second imaging unit) 54 is fixed to the Z-axis moving plate 46 with the intermediary of a support arm 52 that is long in the X-axis direction. The lower-side imaging unit 54 of the present embodiment includes a low magnification camera 56 and a high magnification camera 58.

Each of the low magnification camera 56 and the high magnification camera 58 has a predetermined optical system with a lens and so forth and an imaging element (second imaging element) such as a CCD image sensor or a CMOS image sensor. The lower-side imaging unit 54 is disposed on the lower side relative to the chuck table 10 and is disposed opposed to the other surface 12b in such a manner that the optical axis of each lens is substantially perpendicular to the other surface 12b of the holding component 12. An illuminating device 56a that irradiates a subject (for example, the workpiece 11) located on the upper side with visible light is disposed on a lateral side of the low magnification camera 56. Similarly, an illuminating device 58a is disposed on a lateral side of the high magnification camera 58.

In the case of imaging the workpiece 11 by the lower-side imaging unit 54, the X-axis moving table 18 is moved to the side of the Y-axis moving table 36 and the lower-side imaging unit 54 is disposed in the space 18d. Then, the workpiece 11 disposed on the side of the one surface 12a of the holding component 12 is imaged from the lower side. In this manner, a normal image (i.e., an image as actually seen) of the side of the front surface 11a can be acquired. The lower-side imaging unit 54 is not necessarily required to have the two cameras of the low magnification camera 56 and the high magnification camera 58. The lower-side imaging unit 54 may have only one camera with a predetermined magnification.

Here, referring back to FIG. 1, other constituents of the cutting apparatus 2 will be described. On the +X direction side and the −X direction side relative to the top plate 18c of the X-axis moving table 18, an accordion-shaped, dust-proof, drip-proof cover that can freely expand and contract is attached in such a manner as to cover the opening 4b. Over the opening 4b, a gate-shaped support structure 4c is disposed to straddle the opening 4b. Two processing unit movement mechanisms (indexing feed unit, cutting-in feed unit) 60 are disposed on one side surface located on the side of the opening 4a in the side surfaces of the support structure 4c.

The respective processing unit movement mechanisms 60 share a pair of Y-axis guide rails 62 that are fixed to the one side surface of the support structure 4c and are substantially parallel to the Y-axis direction. Two Y-axis moving plates 64 are attached to the Y-axis guide rails 62 in such a manner as to be capable of sliding independently of each other. A nut part (not illustrated) is disposed on one surface of the Y-axis moving plate 64 located on the side of the support structure 4c, and a Y-axis ball screw 66 substantially parallel to the Y-axis guide rails 62 is rotatably joined to this nut part. The nut parts of the respective Y-axis moving plates 64 are joined to the different Y-axis ball screws 66.

A Y-axis pulse motor 68 is joined to one end part of each Y-axis ball screw 66. When the Y-axis ball screw 66 is rotated by the Y-axis pulse motor 68, the Y-axis moving plate 64 moves in the Y-axis direction along the Y-axis guide rails 62. A pair of Z-axis guide rails 72 substantially parallel to the Z-axis direction are each disposed on the other surface of each Y-axis moving plate 64 located on the opposite side of the support structure 4c. Z-axis moving plates 70 are slidably attached to the Z-axis guide rails 72.

A nut part (not illustrated) is disposed on one surface of the Z-axis moving plate 70 located on the side of the support structure 4c, and a Z-axis ball screw 74 parallel to the Z-axis guide rails 72 is rotatably joined to this nut part. A Z-axis pulse motor 76 is joined to one end part of the Z-axis ball screw 74. When the Z-axis ball screw 74 is rotated by the Z-axis pulse motor 76, the Z-axis moving plate 70 moves in the Z-axis direction along the Z-axis guide rails 72.

Cutting units (processing units) 78 are disposed at the lower parts of the Z-axis moving plates 70. The cutting unit 78 includes a cylindrical spindle housing 80. Part of a circular columnar spindle 82a (see FIG. 9) is rotatably housed in the spindle housing 80. A rotational drive mechanism (not illustrated) such as a servomotor that rotates the spindle 82a is joined to one end of the spindle 82a. Further, a cutting blade 82b having a circular annular cutting edge is mounted on the other end of the spindle 82a.

Upper-side imaging units (first imaging units) 84 are joined to the lower parts of the Z-axis moving plates 70 in such a manner as to be adjacent to the cutting unit 78. The upper-side imaging unit 84 has a predetermined optical system with a lens and so forth and an imaging element (first imaging element). The upper-side imaging unit 84 is located over the chuck table 10 and is disposed opposed to the one surface 12a of the holding component 12 in such a manner that the optical axis of the lens is substantially perpendicular to the one surface 12a. The upper-side imaging unit 84 images the back surface 11b of the workpiece 11 of which the side of the front surface 11a is held by the one surface 12a. In this manner, a normal image of the side of the back surface 11b can be acquired.

An opening 4d is made at a position on the opposite side of the opening 4a with respect to the opening 4b. A cleaning unit 86 for cleaning the workpiece 11 and so forth after cutting is disposed in the opening 4d. The cleaning unit 86 includes a cleaning table 88 that sucks and holds the workpiece 11 and a nozzle 90 having a jet port disposed opposed to the cleaning table 88. A casing that is not illustrated in the diagram is disposed on the base 4, and a touch panel (display device) 92 that serves as both an input part and a display part is disposed on a side surface of the casing on the front side. On the touch panel 92, an image obtained by imaging by at least one of the lower-side imaging unit 54 and the upper-side imaging unit 84, processing conditions, a graphical user interface (GUI), and so forth are displayed.

The input part and the display part may be separated. In this case, instead of the touch panel 92, a display device such as a video monitor or a computer screen and an input device such as a keyboard and a mouse that serves as a user interface are disposed on the side surface of the casing on the front side, for example. The cutting apparatus 2 includes a control part 94 that controls the suction source 14, the X-axis movement mechanism 26, the rotational drive source 30, the Y-axis movement mechanism 32, the Z-axis movement mechanism 42, the lower-side imaging unit 54, the processing unit movement mechanisms 60, the upper-side imaging units 84, the cutting units 78, the touch panel 92, and so forth.

For example, the control part 94 is configured by a computer including a processing device such as a processor typified by a central processing unit (CPU), a main storing device, such as a dynamic random access memory (DRAM), a static random access memory (SRAM), and a read only memory (ROM), and an auxiliary storing device such as a flash memory, a hard disk drive, and a solid state drive. Software including a predetermined program is stored in the auxiliary storing device. Functions of the control part 94 are implemented by causing the processing device and so forth to operate according to this software. Part of the auxiliary storing device functions as a storing device 96 that stores a program that causes the control part 94 to execute predetermined image processing.

In the storing device 96, a program that executes image processing of inverting an image in a predetermined direction is stored. By the image processing, an image of the side of the front surface 11a is inverted in the X-axis direction (left-right inversion), for example. One example of an algorithm to invert an image in the X-axis direction will briefly be described. Consideration will be made regarding the case in which the coordinates of the four corners of the image are $(x_1, y_1)$, $(x_1, y_2)$, $(x_2, y_1)$, and $(x_2, y_2)$. In this case, a pixel value at the pixel of $(x_1, y_1)$ and a pixel value at the pixel of $(x_2, y_1)$ are interchanged with respect to $((x_1+x_2)/2, y_1)$. The image can be inverted in the X-axis direction by executing similar operation also on pixels of other coordinates with respect to the straight line that passes through $(x_1+x_2)/2$ and is parallel to the Y-axis. The method for image inversion is not limited to this example, and another algorithm to invert an image in a predetermined direction may be employed.

Further, a program that executes image processing of pattern matching and so forth is stored in the storing device 96. This program is known, and a predetermined pattern formed on the side of the front surface 11a is extracted from an image of the side of the front surface 11a by using this program. The predetermined pattern is, for example, the contour of the planned dividing line 13, the device 15, the mark 98, and a circuit 100 (see FIG. 7A and so forth). The mark 98 is referred to as an alignment mark, a key pattern, a target pattern, or the like in some cases.

Figure 7A:
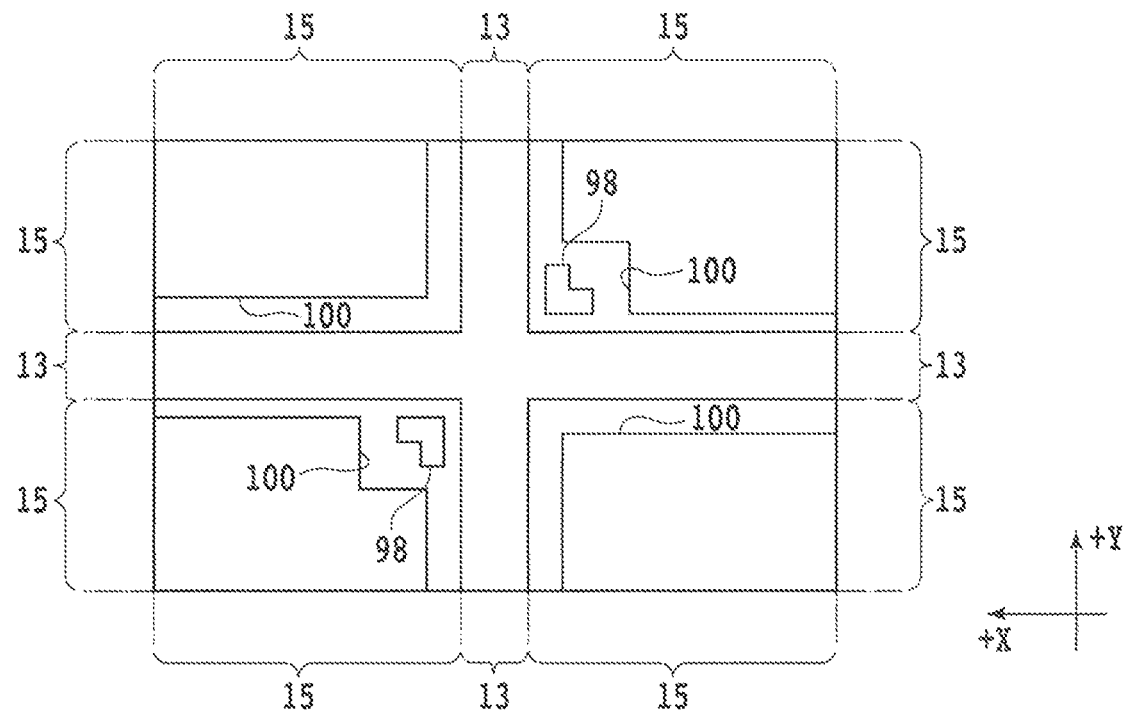
FIG. 7A is one example of an image of the front surface side.

FIG. 7A is one example of an image of the side of the front surface 11a. In the case of causing the touch panel 92 to display a normal image of the side of the front surface 11a acquired by the lower-side imaging unit 54 and a normal image of the side of the back surface 11b acquired by the upper-side imaging unit 84 as they are, the normal image of the side of the front surface 11a illustrated in FIG. 7A is inverted in the X-axis direction compared with the normal image of the side of the back surface 11b. As a result, for example, the left direction in the image of the side of the front surface 11a corresponds to the right direction in the image of the side of the back surface 11b. Therefore, it is not easy for the operator to recognize the correspondence relation between the side of the front surface 11a and the side of the back surface 11b. This imposes a burden on the operator that operates the cutting apparatus 2.

Figure 7B:
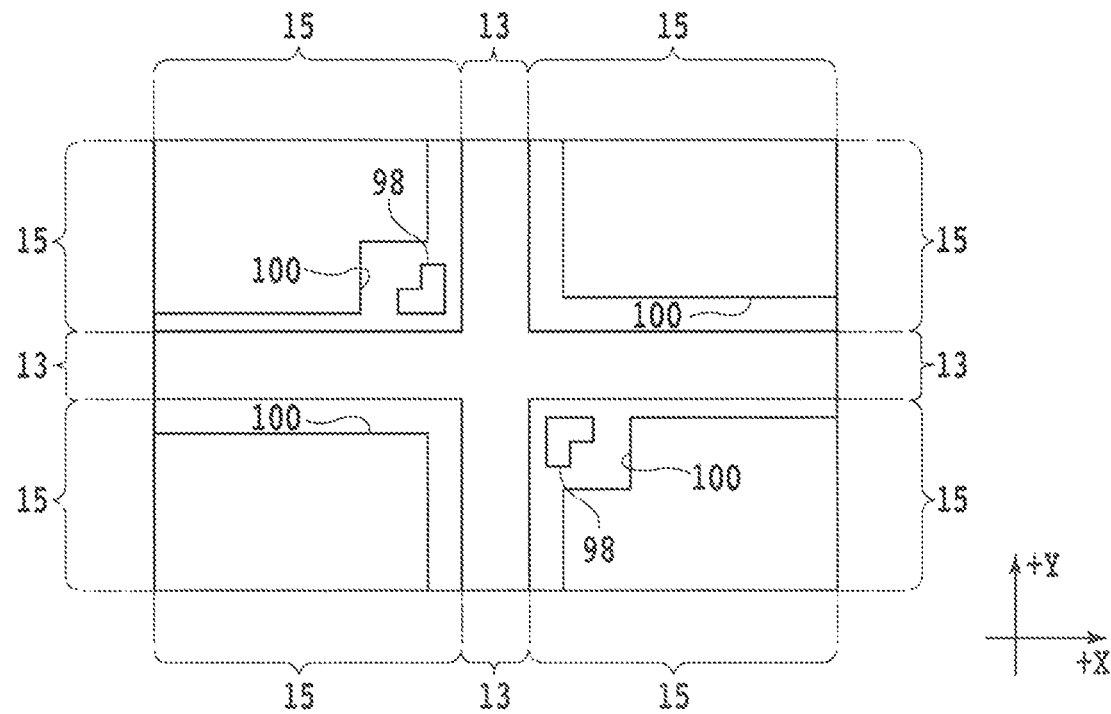
FIG. 7B is one example of an image of the front surface side inverted in a predetermined direction.

In the present embodiment, the control part 94 executes image processing of the normal image of the side of the front surface 11a to cause this normal image to be displayed on the touch panel 92 in the state of being inverted with respect to the X-axis direction (predetermined direction) (i.e., state of a mirror image) so that the orientation of the normal image of the side of the back surface 11b corresponds with the orientation of the normal image of the side of the front surface 11a. FIG. 7B is one example of the image of the side of the front surface 11a inverted in the predetermined direction so that the orientation thereof corresponds with the orientation of the image of the side of the back surface 11b. FIG. 7B is a mirror image of FIG. 7A. The normal image of the side of the front surface 11a is displayed on the touch panel 92 in the state of the mirror image illustrated in FIG. 7B. This allows the operator to view the side of the front surface 11a as if the operator were viewing the front surface 11a (lower side) from the back surface 11b (upper surface) through the workpiece 11. Therefore, it becomes easy to recognize the correspondence relation between the side of the front surface 11a and the side of the back surface 11b, and the burden on the operator is reduced.

The image of the side of the front surface 11a and the image of the side of the back surface 11b may be selectively displayed on the touch panel 92, and the image of the side of the front surface 11a may be displayed on the touch panel 92 together with the image of the side of the back surface 11b. For example, an image 23b of a region including a cut groove (kerf) formed on the side of the back surface 11b and an image 23a of a region on the side of the front surface 11a corresponding to this region on the side of the back surface 11b in the thickness direction of the workpiece 11 are simultaneously displayed on the touch panel 92 (see FIG. 8A). The respective positions of the upper-side imaging unit 84 and the lower-side imaging unit 54 relative to the chuck table 10 are recognized by the control part 94. Therefore, in the workpiece 11 held by the one surface 12a of the chuck table 10, a predetermined region on the side of the back surface 11b and a region on the side of the front surface 11a corresponding to this region can be identified.

Figure 8A:
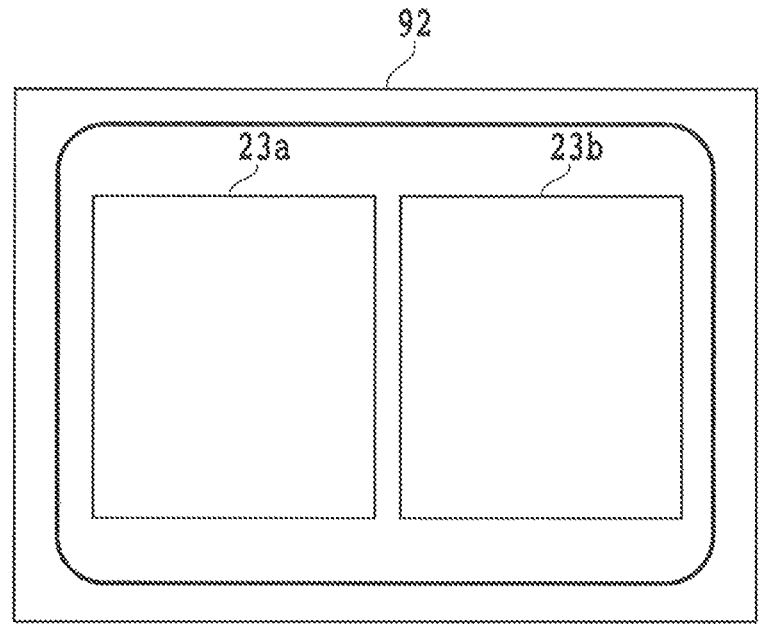
FIG. 8A is one example of a display method of an image of the front surface side and an image of the back surface side.
Figure 8B:
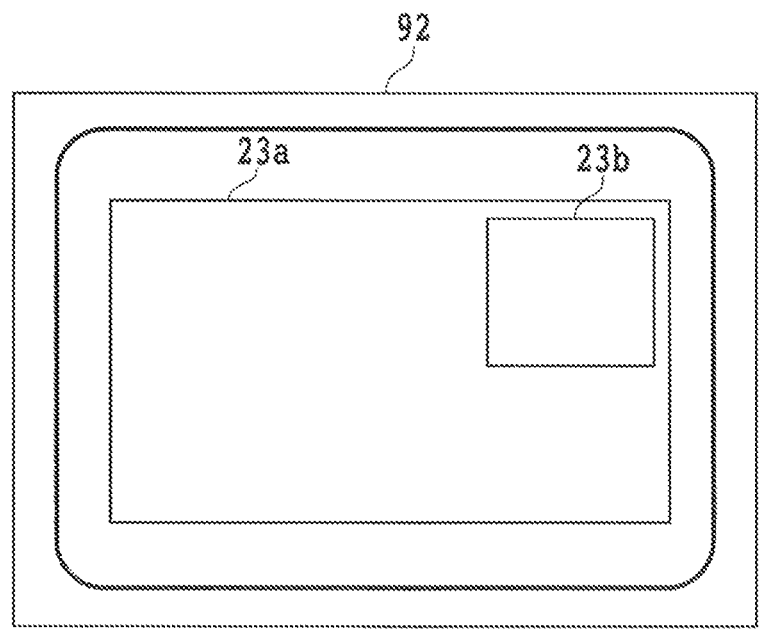
FIG. 8B is another example of the display method of the image of the front surface side and the image of the back surface side.

FIG. 8A is one example of a display method of the image 23a of a mirror image of the side of the front surface 11a and the image 23b of a normal image of the side of the back surface 11b each displayed on the touch panel 92. By displaying both the image 23a and the image 23b, execution of kerf check is facilitated compared with the case in which the image 23a and the image 23b are alternatively displayed. The image 23a and the image 23b do not necessarily need to be displayed side by side as in FIG. 8A. FIG. 8B is another example of the display method of the image 23a of the side of the front surface 11a and the image 23b of the side of the back surface 11b.

As illustrated in FIG. 8B, the image 23b of the side of the back surface 11b may be displayed at part of the image 23a of the side of the front surface 11a. Needless to say, another display method may be employed as long as the operator can simultaneously observe the image 23a and the image 23b. Further, when both mirror and normal images of the side of the front surface 11a are displayed, an image of a mirror image of the side of the front surface 11a may be employed as the image 23a, an image of a normal image of the side of the front surface 11a may be employed as the image 23b, and the image 23a and the image 23b may be displayed on the touch panel 92 as in FIG. 8A. Instead of this, an image of a normal image of the side of the front surface 11a may be employed as the image 23a, and an image of a mirror image of the side of the front surface 11a may be employed as the image 23b.

Figure 9:
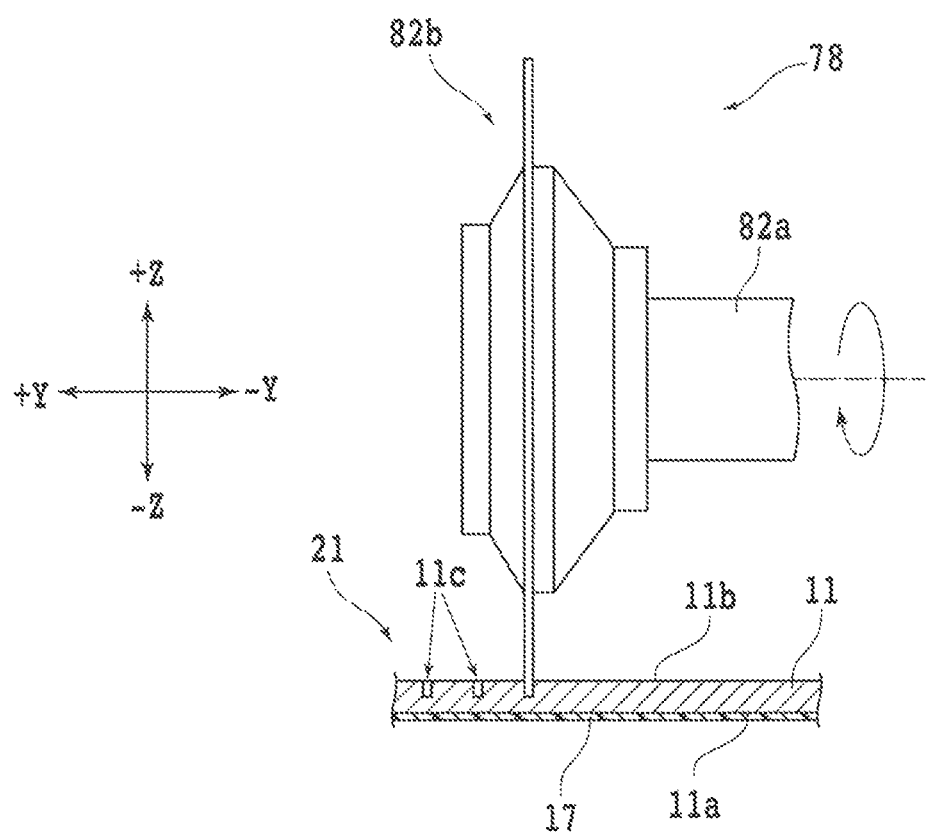
FIG. 9 is a diagram illustrating a cutting step.
Figure 10:
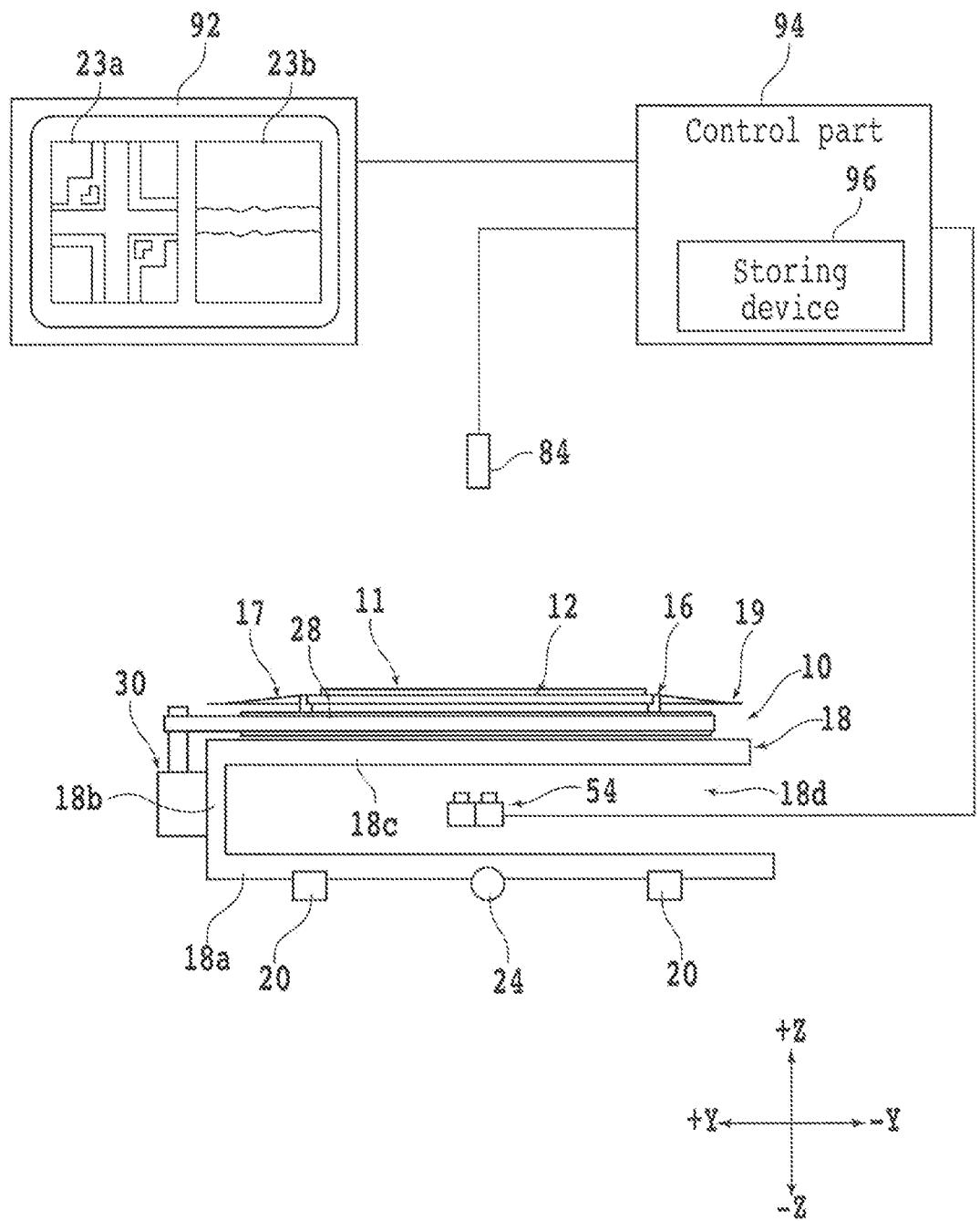
FIG. 10 is a diagram illustrating a kerf check step.

Next, a processing method of the workpiece 11 will be described by using FIG. 9, FIG. 10, and so forth. First, the workpiece unit 21 is placed on the one surface 12a of the chuck table 10 in such a manner that the side of the back surface 11b is exposed upward (placement step S10). After the placement step S10, the suction source 14 is operated to hold the side of the front surface 11a of the workpiece 11 by the one surface 12a with the intermediary of the tape 17 and hold the frame 19 by the frame suction plate (not illustrated) (holding step S20). After the holding step S20, a teaching step S30 is executed.

In the teaching step S30, for example, a normal image of the side of the front surface 11a is imaged by using the lower-side imaging unit 54, and the operator searches for the mark 98 on the side of the front surface 11a in the state in which an image obtained by converting this normal image to a mirror image is displayed on the touch panel 92 in real time. After the desired mark 98 is found, an image of the side of the front surface 11a including the mark 98 is acquired by the lower-side imaging unit 54. The shape, coordinates, and so forth of the mark 98 are stored in, for example, the storing device 96 as a template of pattern matching. Further, the distance between the mark 98 and the center line of the planned dividing line 13 and the distance between two planned dividing lines 13 adjacent in the Y-axis direction (street pitch) are stored in the storing device 96. The respective coordinates stored are XY-coordinates defined with the above-described intersection $12c_3$ being the origin.

After the teaching step S30, alignment of the workpiece 11 is executed (alignment step S40). Also in the alignment step S40, the operator executes operation in the state in which an image obtained by converting a normal image of the side of the front surface 11a acquired by the lower-side imaging unit 54 to a mirror image is displayed on the touch panel 92 in real time. In the alignment step S40, first, images of the side of the front surface 11a are acquired by using the lower-side imaging unit 54 (for example, the low magnification camera 56) at plural places separate from each other in one planned dividing line 13 along the X-axis direction.

Then, in the images of the side of the front surface 11a acquired at the plural places, the same pattern as the mark 98 stored as the template is detected by predetermined processing such as pattern matching. Based on the detected pattern that is the same as the mark 98, deviation of the planned dividing line 13 in a θ direction around the center axis of the holding component 12 is identified. Thereafter, the rotational drive source 30 is operated and the belt 28 is rotated by a predetermined amount to correct the deviation of the planned dividing line 13 in the θ direction. The planned dividing line 13 is thereby positioned substantially in parallel to the X-axis direction. In the alignment step S40, predetermined processing, operation, and so forth other than the correction in the θ direction may be executed.

After the alignment step S40, the workpiece 11 is cut (processed) (cutting step S50). FIG. 9 is a diagram illustrating the cutting step S50. In the cutting step S50, first, the cutting blade 82b that is rotating at high speed is positioned on an extended line of the planned dividing line 13. At this time, the lower end of the cutting blade 82b is positioned between the front surface 11a and the back surface 11b of the workpiece 11. Then, the chuck table 10 and the cutting blade 82b are relatively moved along the X-axis direction by the X-axis movement mechanism 26.

The workpiece 11 is thereby partly cut (processed) (that is, half-cut) by the cutting blade 82b from the side of the back surface 11b to a predetermined depth that does not reach the front surface 11a in the thickness direction of the workpiece 11, so that a cut groove 11c is formed along the planned dividing line 13. The cutting in the cutting step S50 is not limited to the half cutting. In the cutting step S50, the workpiece 11 may be cut to be severed from the back surface 11b to the front surface 11a (that is, fully cut).

After the workpiece 11 is cut along the one planned dividing line 13 parallel to the X-axis direction, indexing feed of the cutting unit 78 is executed to position the cutting blade 82b on an extended line of the planned dividing line 13 adjacent in the Y-axis direction. Then, similarly, the workpiece 11 is cut along the planned dividing line 13. After the workpiece 11 is cut along all planned dividing lines 13 parallel to a first direction in this manner, the rotational drive source 30 is operated to rotate the chuck table 10 by 90 degrees. Then, a second direction orthogonal to the first direction is positioned in parallel to the X-axis direction, and the workpiece 11 is cut along all planned dividing lines 13 parallel to the second direction.

After the cutting step S50, a kerf check step S60 is executed. FIG. 10 is a diagram illustrating the kerf check step S60. In the kerf check step S60, a region on the side of the back surface 11b including the cut grooves 11c and a region on the side of the front surface 11a mutually corresponding to this region in the thickness direction of the workpiece 11 are imaged. Then, on the touch panel 92, a normal image of the side of the back surface 11b is displayed as the image 23b and a mirror image of the side of the front surface 11a is displayed as the image 23a. This makes it easy to recognize the correspondence relation between the side of the front surface 11a and the side of the back surface 11b, and, therefore, the burden on the operator at the time of kerf check is reduced. Incidentally, although the mirror image is created through executing image processing of the normal image of the side of the front surface 11a in the present embodiment, the mirror image may be created through executing image processing of the normal image of the side of the back surface 11b. In this case, on the touch panel 92, the normal image of the side of the front surface 11a is displayed as the image 23a and the mirror image of the side of the back surface 11b is displayed as the image 23b.

Figure 11:
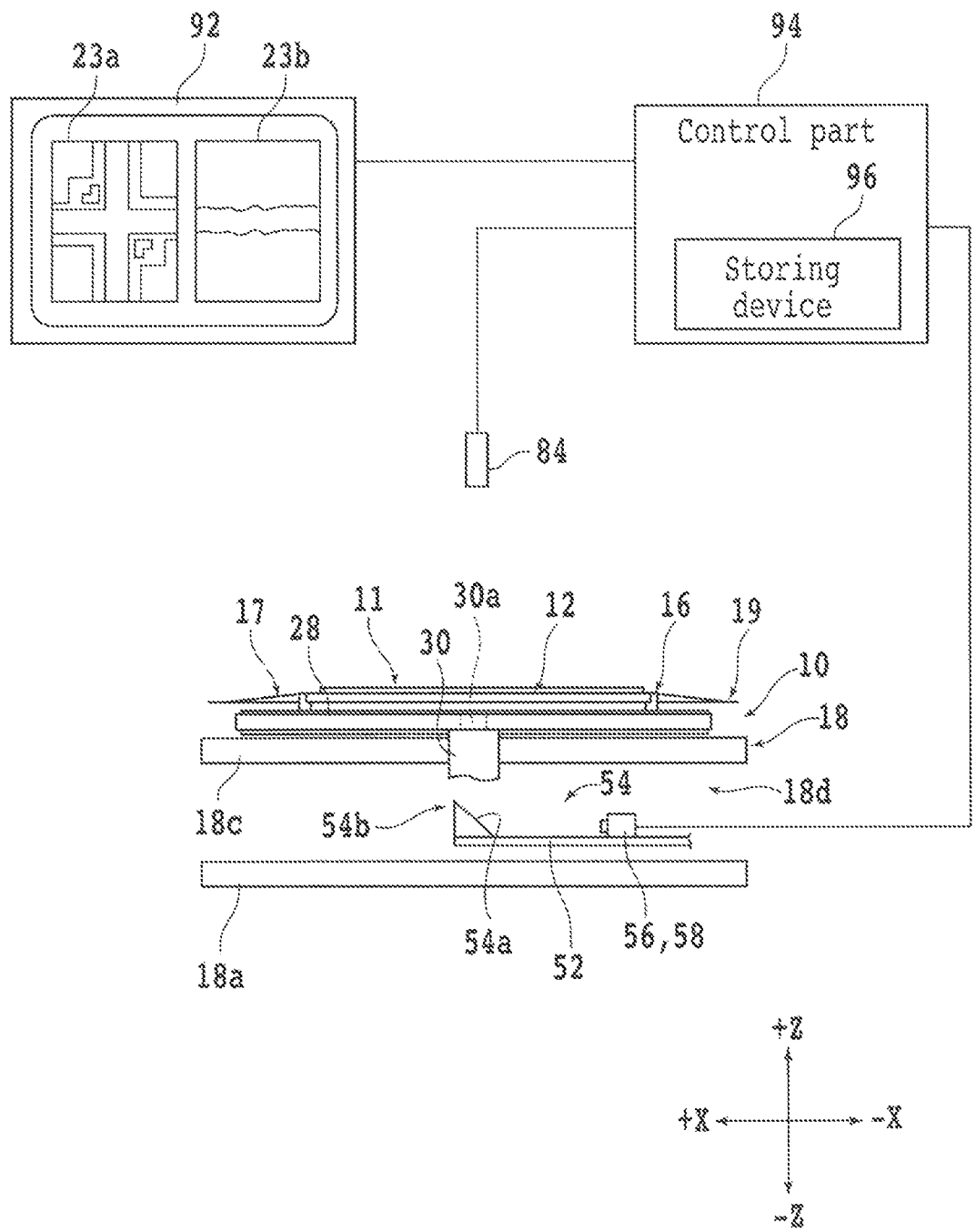
FIG. 11 is a diagram illustrating a lower-side imaging unit and so forth according to a first modification example.

Next, a first modification example will be described. In the first modification example, the upper-side imaging unit 84 acquires a normal image of the side of the back surface 11b, and the lower-side imaging unit 54 (third imaging unit) acquires a mirror image of the side of the front surface 11a. Then, without executing inversion processing for the images of the side of the back surface 11b and the side of the front surface 11a, the control part 94 causes both to be displayed on the touch panel 92. FIG. 11 is a diagram illustrating the lower-side imaging unit 54 and so forth according to the first modification example. In FIG. 11, the side plate 18b is omitted for convenience. In the lower-side imaging unit 54 according to the first modification example, the low magnification camera 56 and the high magnification camera 58 each having lens, imaging element (third imaging element), and so forth are disposed between both ends of the support arm 52 in the longitudinal direction.

The optical axis of the lens of each of the low magnification camera 56 and the high magnification camera 58 is disposed substantially in parallel to the X-axis direction. Illuminating devices 56a and 58a are disposed for the respective cameras, but diagrammatic representation thereof is omitted. At the tip part of the support arm 52, a mirror unit 54b that has a mirror surface 54a inclined to the X-axis by 45 degrees in the XZ-plane and guides reflected light from the side of the front surface 11a to the low magnification camera 56 and the high magnification camera 58 is disposed.

Each camera images the side of the front surface 11a reflected in the mirror by the mirror unit 54b, and thereby, the lower-side imaging unit 54 can acquire an image of the side of the front surface 11a inverted in the X-axis direction (i.e., mirror image). Then, the mirror image of the side of the front surface 11a and the normal image of the side of the back surface 11b are displayed on the touch panel 92 as they are. This allows the operator to view the side of the front surface 11a as if the operator were viewing the front surface 11a from the back surface 11b through the workpiece 11. Therefore, it becomes easy to recognize the correspondence relation between the side of the front surface 11a and the side of the back surface 11b. Consequently, the burden on the operator is reduced. The mirror unit 54b may be disposed between the lens and the imaging element in each of the low magnification camera 56 and the high magnification camera 58. In this case, each lens is disposed in such a manner that the optical axis of the lens is along the Z-axis direction.

Incidentally, image processing may be executed by using the control part 94 in the first modification example. For example, the control part 94 executes image processing of both a normal image of the side of the back surface 11b and a mirror image of the side of the front surface 11a to cause the normal image and the mirror image to be displayed on the touch panel 92 in the state of being inverted in a predetermined direction so that the orientation of the normal image of the side of the back surface 11b corresponds with the orientation of the mirror image of the side of the front surface 11a. This allows the operator to view the side of the back surface 11b as if the operator were viewing the back surface 11b from the front surface 11a through the workpiece 11. Therefore, it becomes easy to recognize the correspondence relation between the side of the front surface 11a and the side of the back surface 11b. Consequently, the burden on the operator is reduced.

Figure 12:
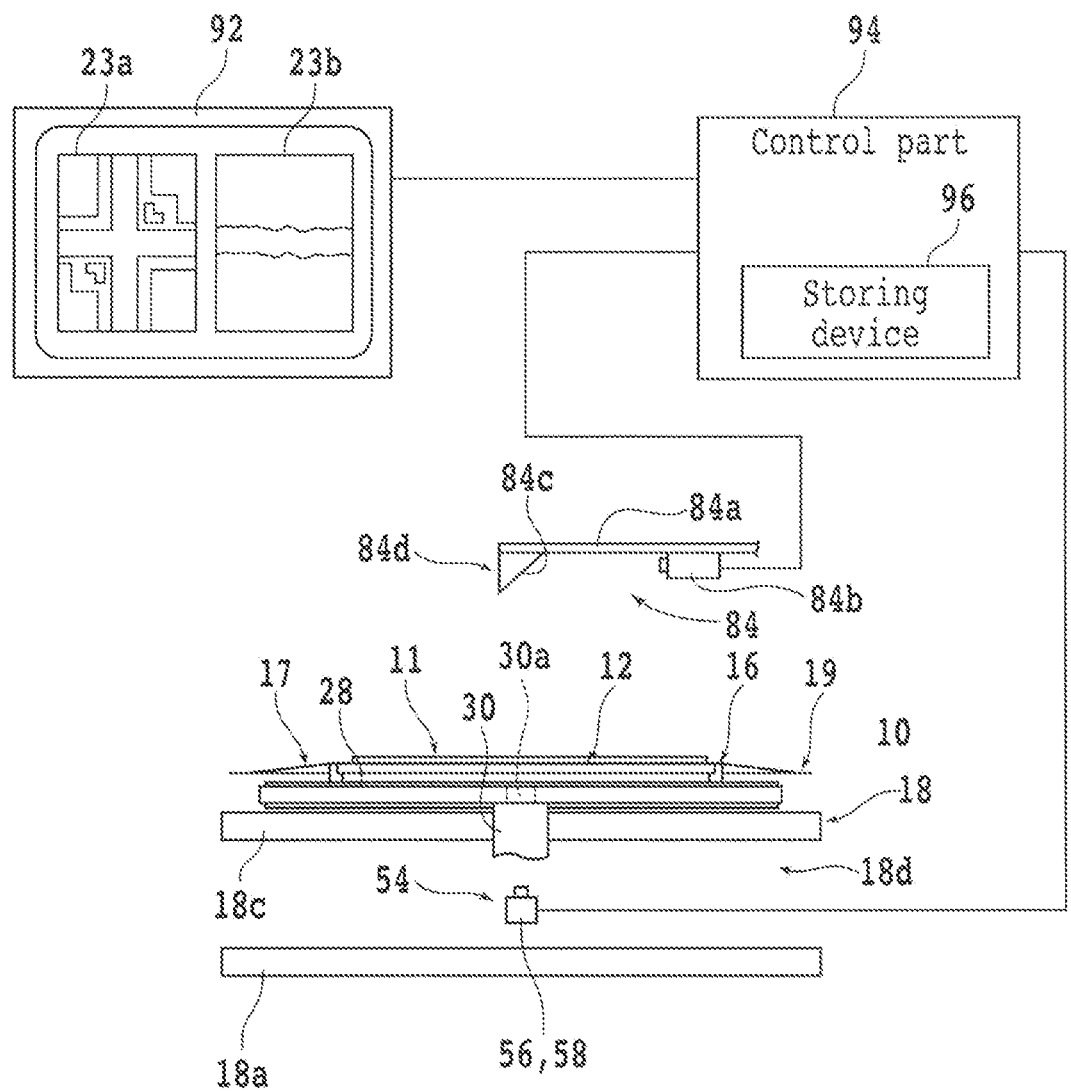
FIG. 12 is a diagram illustrating an upper-side imaging unit and so forth according to a second modification example.

Next, a second modification example will be described. In the second modification example, the upper-side imaging unit 84 (fourth imaging unit) acquires a mirror image of the side of the back surface 11b, and the lower-side imaging unit 54 (second imaging unit) acquires a normal image of the side of the front surface 11a. Then, without executing inversion processing for the images of the side of the back surface 11b and the side of the front surface 11a, the control part 94 causes both to be displayed on the touch panel 92. FIG. 12 is a diagram illustrating the upper-side imaging unit 84 and so forth according to the second modification example. In FIG. 12, the side plate 18b is omitted for convenience.

In the upper-side imaging unit 84 according to the second modification example, a camera 84b having a lens, an imaging element (fourth imaging element), and so forth is disposed between both ends of a support arm 84a in the longitudinal direction. The optical axis of the lens of the camera 84b is disposed substantially in parallel to the X-axis direction. At the tip part of the support arm 84a, a mirror unit 84d that has a mirror surface 84c inclined to the X-axis by 45 degrees in the XZ-plane and guides reflected light from the side of the back surface 11b to the camera 84b is disposed.

The camera 84b images the side of the back surface 11b reflected in the mirror by the mirror unit 84d, and thereby, the upper-side imaging unit 84 can acquire an image of the side of the back surface 11b inverted in the X-axis direction (i.e., mirror image). Then, the mirror image of the side of the back surface 11b and the normal image of the side of the front surface 11a are displayed on the touch panel 92 as they are. The operator can view the side of the back surface 11b as if the operator were viewing the back surface 11b from the front surface 11a through the workpiece 11. Therefore, it becomes easy to recognize the correspondence relation between the side of the front surface 11a and the side of the back surface 11b. Consequently, the burden on the operator is reduced. The mirror unit 84d may be disposed between the lens and the imaging element in the camera 84b. In this case, the lens is disposed in such a manner that the optical axis of the lens is along the Z-axis direction.

Also in the second modification example, image processing may be executed by using the control part 94. For example, the control part 94 executes image processing of both a mirror image of the side of the back surface 11b and a normal image of the side of the front surface 11a to cause the mirror image and the normal image to be displayed on the touch panel 92 in the state of being inverted in a predetermined direction so that the orientation of the mirror image of the side of the back surface 11b corresponds with the orientation of the normal image of the side of the front surface 11a. This allows the operator to view the side of the front surface 11a as if the operator were viewing the front surface 11a from the back surface 11b through the workpiece 11. Therefore, it becomes easy to recognize the correspondence relation between the side of the front surface 11a and the side of the back surface 11b. Consequently, the burden on the operator is reduced.

Figure 13:
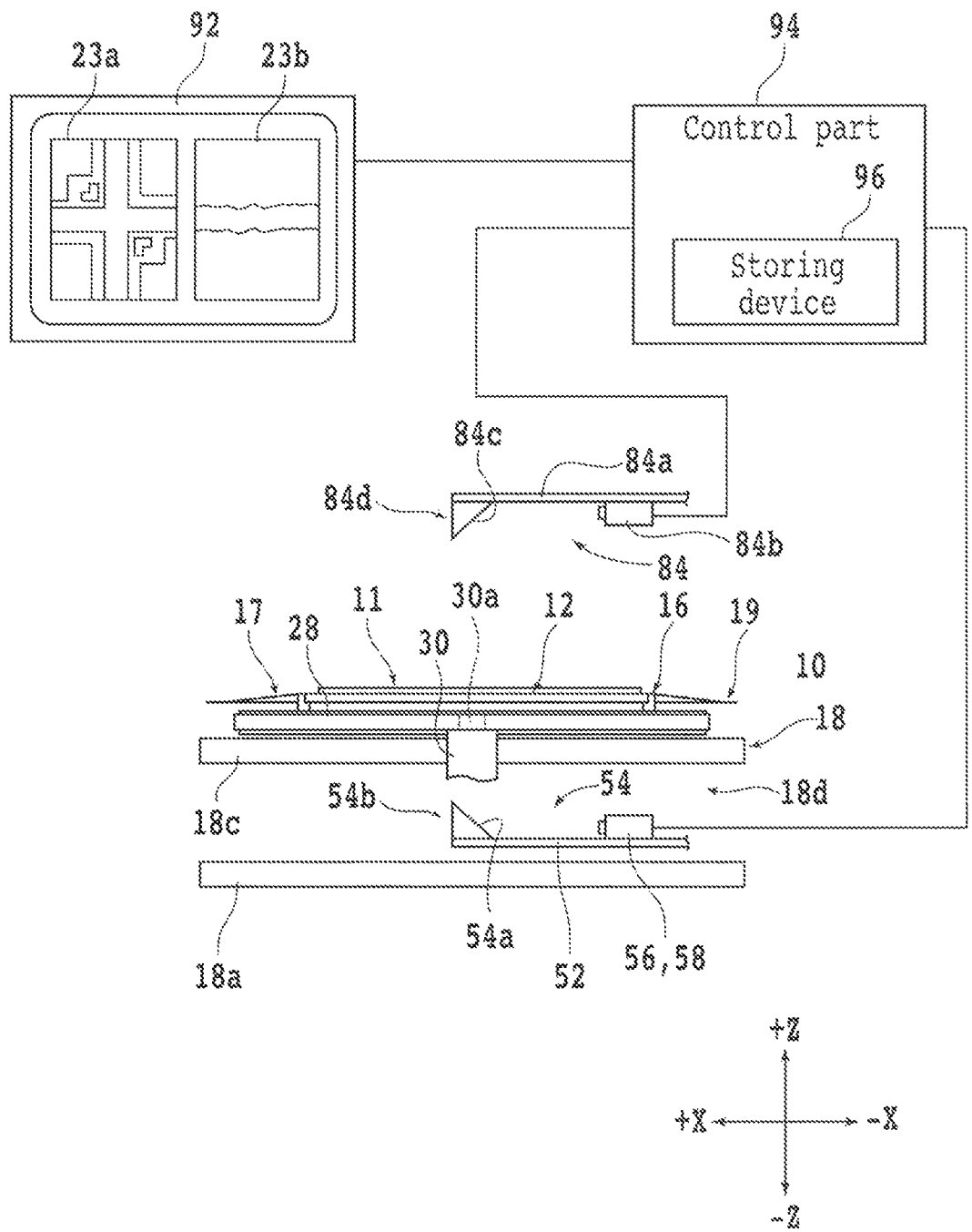
FIG. 13 is a diagram illustrating the lower-side imaging unit, the upper-side imaging unit, and so forth according to a third modification example.

Next, a third modification example will be described. In the third modification example, the upper-side imaging unit 84 (fourth imaging unit) acquires a mirror image of the side of the back surface 11b, and the lower-side imaging unit 54 (third imaging unit) acquires a mirror image of the side of the front surface 11a. Then, the control part 94 executes inversion processing for either of the images of the side of the back surface 11b or the side of the front surface 11a and thereafter causes both to be displayed on the touch panel 92. FIG. 13 is a diagram illustrating the lower-side imaging unit 54, the upper-side imaging unit 84, and so forth according to the third modification example. In FIG. 13, the side plate 18b is omitted for convenience.

The lower-side imaging unit 54 according to the third modification example is the same as the first modification example, and the upper-side imaging unit 84 according to the third modification example is the same as the second modification example. Either the mirror image of the side of the back surface 11b or the mirror image of the side of the front surface 11a is subjected to image processing and is displayed on the touch panel 92 in the state of being inverted in a predetermined direction. For example, a mirror image of the side of the front surface 11a acquired by the lower-side imaging unit 54 and a normal image of the side of the back surface 11b obtained by inverting a mirror image of the side of the back surface 11b acquired by the upper-side imaging unit 84 in the X-axis direction by the image processing are displayed on the touch panel 92. Further, for example, a normal image of the side of the front surface 11a obtained by inverting a mirror image of the side of the front surface 11a acquired by the lower-side imaging unit 54 in the X-axis direction by the image processing and a mirror image of the side of the back surface 11b acquired by the upper-side imaging unit 84 are displayed on the touch panel 92.

That is, the image of the side of the back surface 11b and the image of the side of the front surface 11a are displayed on the touch panel 92 in such a manner that the orientations thereof corresponds with each other. Due to this, it becomes easy for the operator to recognize the correspondence relation between the side of the front surface 11a and the side of the back surface 11b. Therefore, the burden on the operator is reduced. Similarly to the first and second modification examples, the mirror units 54b and 84d may be disposed between the lens and the imaging element. In this case, each lens is disposed in such a manner that the optical axis of the lens is along the Z-axis direction.

Figure 14:
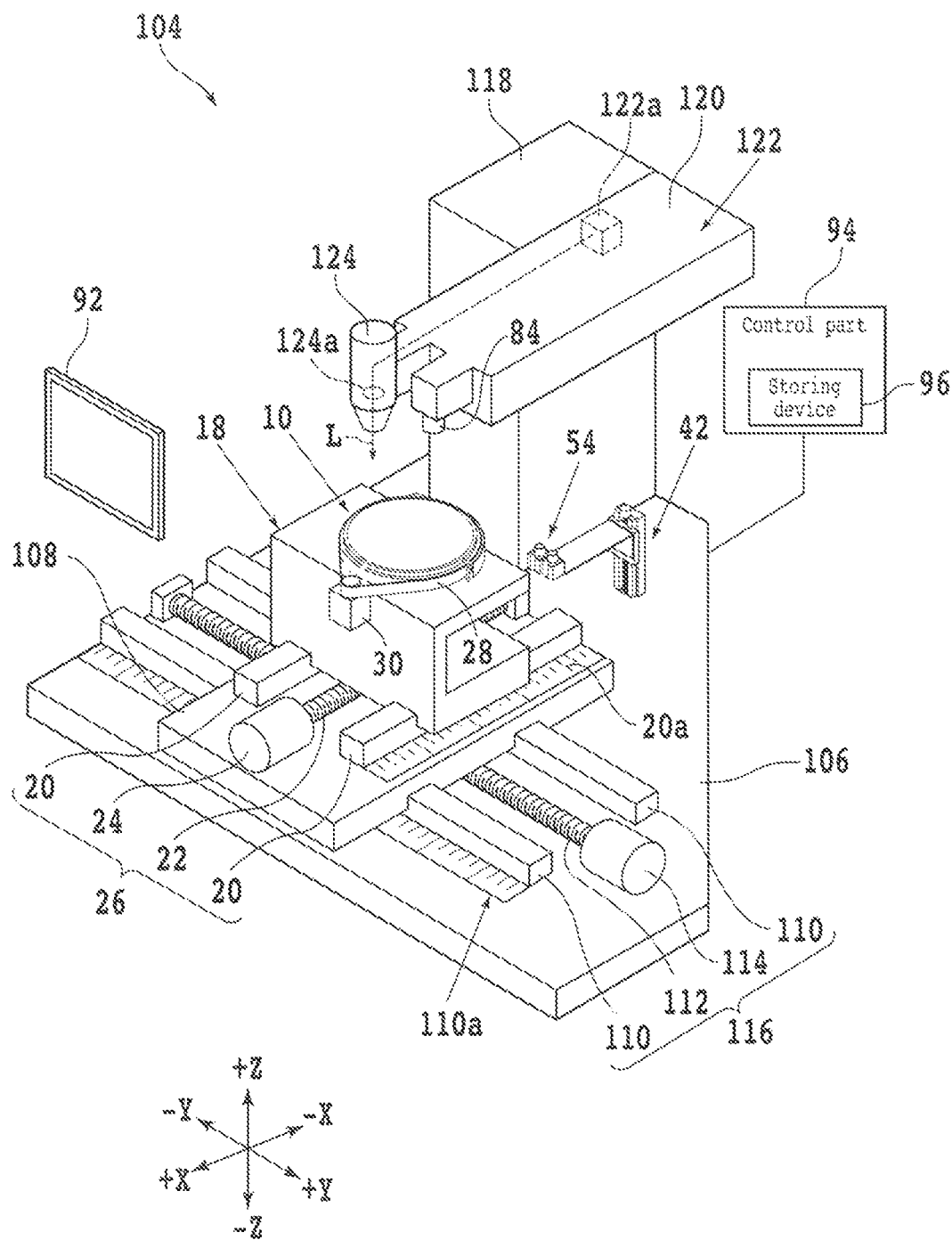
FIG. 14 is a perspective view of a laser processing apparatus.

Next, a second embodiment will be described. In the second embodiment, the workpiece 11 is processed by using a laser processing apparatus (processing apparatus) 104 instead of the cutting apparatus 2. However, the above-described placement step S10 to the alignment step S40 are executed as with the first embodiment. FIG. 14 is a perspective view of the laser processing apparatus 104 according to the second embodiment. The same constituent as the cutting apparatus 2 according to the first embodiment is given the same symbol. In the following, the difference from the cutting apparatus 2 will mainly be described.

In the laser processing apparatus 104, the lower-side imaging unit 54 is fixed to a stationary base 106. The lower-side imaging unit 54 may be disposed movably in the X-axis direction or the Y-axis direction. The X-axis moving table 18 is disposed over the stationary base 106. The X-axis moving table 18 is disposed in such a manner that the lower-side imaging unit 54 can enter the space 18d from a region located on the opposite side of the side plate 18b of the X-axis moving table 18.

The X-axis moving table 18 can slidably be disposed on a pair of X-axis guide rails 20. The pair of X-axis guide rails 20 are fixed onto a Y-axis moving table 108. A nut part (not illustrated) is disposed on the lower surface side of the bottom plate 18a of the X-axis moving table 18, and the X-axis ball screw 22 substantially parallel to the X-axis guide rails 20 is rotatably joined to this nut part.

The X-axis pulse motor 24 is joined to one end part of the X-axis ball screw 22. When the X-axis ball screw 22 is rotated by the X-axis pulse motor 24, the X-axis moving table 18 moves in the X-axis direction along the X-axis guide rails 20. The Y-axis moving table 108 that supports the X-axis moving table 18 is slidably attached onto a pair of Y-axis guide rails 110 fixed to the upper surface of the stationary base 106. A Y-axis scale 110a used in detection of the position of the Y-axis moving table 108 in the Y-axis direction is disposed at a position adjacent to the Y-axis guide rails 110.

A nut part (not illustrated) is disposed on the lower surface side of the Y-axis moving table 108, and a Y-axis ball screw 112 substantially parallel to the Y-axis guide rails 110 is rotatably joined to this nut part. A Y-axis pulse motor 114 is joined to one end part of the Y-axis ball screw 112. When the Y-axis ball screw 112 is rotated by the Y-axis pulse motor 114, the Y-axis moving table 108 moves in the Y-axis direction along the Y-axis guide rails 110. The Y-axis guide rails 110, the Y-axis ball screw 112, the Y-axis pulse motor 114, and so forth configure a Y-axis movement mechanism 116 that moves the Y-axis moving table 108.

At a position adjacent to the lower-side imaging unit 54, a column 118 is disposed in such a manner as to protrude upward from the upper surface of the stationary base 106. A casing 120 having a longitudinal part substantially parallel to the X-axis direction is disposed on the column 118. At least part of a laser irradiation unit 122 is disposed in the casing 120. The laser irradiation unit 122 has a laser oscillator 122a that generates a pulsed laser beam having such a wavelength as to be absorbed by the workpiece 11 or such a wavelength as to be transmitted through the workpiece 11, and so forth.

An irradiation head 124 including a collecting lens 124a is disposed at the tip part of the laser irradiation unit 122 in the X-axis direction. The laser beam emitted from the laser oscillator 122a is collected by the collecting lens 124a and irradiation of the lower side with the laser beam from the irradiation head 124 is executed. In FIG. 14, a laser beam L with which the lower side is irradiated from the irradiation head 124 is illustrated by a dashed arrow. At the tip part of the casing 120, the above-described upper-side imaging unit 84 is disposed at a position adjacent to the irradiation head 124.

The control part 94 of the second embodiment causes the touch panel 92 to display a mirror image obtained by inverting a normal image of the side of the front surface 11a in the X-axis direction and a normal image of the side of the back surface 11b similarly to the first embodiment. This makes it easy to recognize the correspondence relation between the side of the front surface 11a and the side of the back surface 11b. Therefore, the burden on the operator is reduced. Besides, structures, methods, and so forth according to the above-described embodiments can be carried out with changes as appropriate without departing from the range of the object of the present invention. For example, the first to third modification examples can also be applied in the laser processing apparatus 104. Incidentally, in the above-described embodiments and modification examples, the case in which an image of the side of the front surface 11a is inverted in the X-axis direction has been explained. However, inversion in the Y-axis direction (predetermined direction) may be executed depending on the configuration of the processing apparatus including the mirror surface inclined to the X-axis by 45 degrees in the XZ-plane. The mirror units 54b and 84d may have, instead of the mirror surfaces 54a and 84c, an alternative such as a lens that is disposed separately from the camera and can generate a mirror image.

The present invention is not limited to the details of the above described preferred embodiments. The scope of the invention is defined by the appended claims and all changes and modifications as fall within the equivalence of the scope of the claims are therefore to be embraced by the invention.

What is claimed is:
1. A processing apparatus comprising:
   a chuck table that includes one surface and the other surface located on an opposite side of the one surface and includes a plate-shaped holding component having a predetermined region formed of a transparent material from the one surface to the other surface;
   a processing unit that processes a workpiece having a predetermined pattern on a front surface side in a state in which the front surface side of the workpiece is held by the one surface of the chuck table and a back surface side of the workpiece is exposed upward;
   a first imaging unit that has a first imaging element and that is disposed over the chuck table and acquires a normal image of the back surface side;
   a second imaging unit that has a second imaging element and that is disposed under the chuck table and acquires a normal image of the front surface side in a region corresponding to a region imaged by the first imaging unit in a thickness direction of the workpiece;
   a display device that displays at least one of an image of the back surface side acquired by the first imaging unit and an image of the front surface side acquired by the second imaging unit; and
   a control part that has a storing device in which a program to execute image processing is stored and a processor that processes an image in accordance with the program, the control part executing the image processing of either the normal image of the back surface side or the normal image of the front surface side to cause the normal image subjected to the image processing to be displayed on the display device in a state of being inverted in a predetermined direction in order to allow orientation of the normal image of the back surface side to correspond with orientation of the normal image of the front surface side.

2. The processing apparatus according to claim 1, wherein the image of the front surface side is displayed on the display device together with the image of the back surface side.

3. The processing apparatus according to claim 1, wherein the processing unit is
a cutting unit having a spindle, wherein a cutting blade is configured to be mounted on one end of the spindle, or
a laser irradiation unit having a laser oscillator that generates a laser beam and a collecting lens that collects the laser beam emitted from the laser oscillator.

4. A processing apparatus comprising:
a chuck table that includes one surface and the other surface located on an opposite side of the one surface and includes a plate-shaped holding component having a predetermined region formed of a transparent material from the one surface to the other surface;
a processing unit that processes a workpiece having a predetermined pattern on a front surface side in a state in which the front surface side of the workpiece is held by the one surface of the chuck table and a back surface side of the workpiece is exposed upward;
a first imaging unit that has a first imaging element and that is disposed over the chuck table and acquires a normal image of the back surface side;
a third imaging unit that has a third imaging element and that is disposed under the chuck table and acquires a mirror image of the front surface side in a region corresponding to a region imaged by the first imaging unit in a thickness direction of the workpiece; and
a display device that displays at least one of an image of the back surface side acquired by the first imaging unit and an image of the front surface side acquired by the third imaging unit.

5. The processing apparatus according to claim 4, further comprising:
a control part having a storing device in which a program to execute image processing is stored and a processor that processes an image in accordance with the program, wherein
the control part executes the image processing of both the normal image of the back surface side and the mirror image of the front surface side to cause the normal and mirror images subjected to the image processing to be displayed on the display device in a state of being inverted in a predetermined direction in order to allow orientation of the normal image of the back surface side to correspond with orientation of the mirror image of the front surface side.

6. The processing apparatus according to claim 4, wherein the image of the front surface side is displayed on the display device together with the image of the back surface side.

7. The processing apparatus according to claim 4, wherein the processing unit is
a cutting unit having a spindle, wherein a cutting blade is configured to be mounted on one end of the spindle, or
a laser irradiation unit having a laser oscillator that generates a laser beam and a collecting lens that collects the laser beam emitted from the laser oscillator.

8. A processing apparatus comprising:
a chuck table that includes one surface and the other surface located on an opposite side of the one surface and includes a plate-shaped holding component having a predetermined region formed of a transparent material from the one surface to the other surface;
a processing unit that processes a workpiece having a predetermined pattern on a front surface side in a state in which the front surface side of the workpiece is held by the one surface of the chuck table and a back surface side of the workpiece is exposed upward;
a fourth imaging unit that has a fourth imaging element and that is disposed over the chuck table and acquires a mirror image of the back surface side;
a second imaging unit that has a second imaging element and that is disposed under the chuck table and acquires a normal image of the front surface side in a region corresponding to a region imaged by the fourth imaging unit in a thickness direction of the workpiece; and
a display device that displays at least one of an image of the back surface side acquired by the fourth imaging unit and an image of the front surface side acquired by the second imaging unit.

9. The processing apparatus according to claim 8, further comprising:
a control part having a storing device in which a program to execute image processing is stored and a processor that processes an image in accordance with the program, wherein
the control part executes the image processing of both the mirror image of the back surface side and the normal image of the front surface side to cause the mirror and normal images subjected to the image processing to be displayed on the display device in a state of being inverted in a predetermined direction in order to allow orientation of the mirror image of the back surface side to correspond with orientation of the normal image of the front surface side.

10. The processing apparatus according to claim 8, wherein
the image of the front surface side is displayed on the display device together with the image of the back surface side.

11. The processing apparatus according to claim 8, wherein
the processing unit is
a cutting unit having a spindle, wherein a cutting blade is configured to be mounted on one end of the spindle, or
a laser irradiation unit having a laser oscillator that generates a laser beam and a collecting lens that collects the laser beam emitted from the laser oscillator.

12. A processing apparatus comprising:
a chuck table that includes one surface and the other surface located on an opposite side of the one surface and includes a plate-shaped holding component having a predetermined region formed of a transparent material from the one surface to the other surface;
a processing unit that processes a workpiece having a predetermined pattern on a front surface side in a state in which the front surface side of the workpiece is held by the one surface of the chuck table and a back surface side of the workpiece is exposed upward;
a fourth imaging unit that has a fourth imaging element and that is disposed over the chuck table and acquires a mirror image of the back surface side;
a third imaging unit that has a third imaging element and that is disposed under the chuck table and acquires a mirror image of the front surface side in a region corresponding to a region imaged by the fourth imaging unit in a thickness direction of the workpiece;
a display device that displays at least one of an image of the back surface side acquired by the fourth imaging unit and an image of the front surface side acquired by the third imaging unit; and
a control part that has a storing device in which a program to execute image processing is stored and a processor that processes an image in accordance with the program, the control part executing the image processing of either the mirror image of the back surface side or the mirror image of the front surface side to cause the mirror image subjected to the image processing to be displayed on the display device in a state of being inverted in a predetermined direction in order to allow orientation of the mirror image of the back surface side to correspond with orientation of the mirror image of the front surface side.

13. The processing apparatus according to claim 12, wherein
the image of the front surface side is displayed on the display device together with the image of the back surface side.

14. The processing apparatus according to claim 12, wherein
the processing unit is
a cutting unit having a spindle, wherein a cutting blade is configured to be mounted on one end of the spindle, or
a laser irradiation unit having a laser oscillator that generates a laser beam and a collecting lens that collects the laser beam emitted from the laser oscillator.

* * * * *